US012713728B2

(12) United States Patent
Jang et al.

(10) Patent No.: US 12,713,728 B2
(45) Date of Patent: Aug. 18, 2026

(54) HIGHLY INTEGRATED IMAGE SENSORS USING INTER-SUBSTRATE WIRING STRUCTURES

(71) Applicant: Samsung Electronics Co., Ltd., Suwon-si (KR)

(72) Inventors: Minho Jang, Suwon-si (KR); Doowon Kwon, Suwon-si (KR); Kyungtae Lim, Suwon-si (KR); Donghyun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 479 days.

(21) Appl. No.: 18/295,966

(22) Filed: Apr. 5, 2023

(65) Prior Publication Data

US 2024/0014243 A1 Jan. 11, 2024

(30) Foreign Application Priority Data

Jul. 5, 2022 (KR) ........................ 10-2022-0082419

(51) Int. Cl.

*H10F 39/00* (2025.01)
*H10F 39/12* (2025.01)
*H10F 39/18* (2025.01)

(52) U.S. Cl.

CPC ......... *H10F 39/809* (2025.01); *H10F 39/018* (2025.01); *H10F 39/182* (2025.01); (Continued)

(58) Field of Classification Search

CPC ..... H10F 39/018; H10F 39/809; H10F 39/811

See application file for complete search history.

(56) References Cited

U.S. PATENT DOCUMENTS 10,163,946 B2 12/2018 Kwon
11,201,185 B2 12/2021 Mitsuhashi et al.
(Continued)

FOREIGN PATENT DOCUMENTS

CN 113169197 A 7/2021
KR 20200097716 A 8/2020
KR 10-2021-0075075 A 6/2021

*Primary Examiner* — Christine S. Kim
*Assistant Examiner* — Tyler J Wiegand
(74) *Attorney, Agent, or Firm* — Wolf, Greenfield & Sacks, P.C.

(57) ABSTRACT

An image sensor includes a first substrate having a first transistor integrated therein, and a first plurality of wiring structures on the first substrate. The first plurality of wiring structures include a first wiring structure electrically connected to the first transistor. A second substrate extends on the first plurality of wiring structures, and has a second transistor integrated therein, which is electrically connected to a second wiring structure within the first plurality of wiring structures. A second plurality of wiring structures extend on the second substrate. A third substrate is provided on the second plurality of wiring structures. A microlens extends on a light receiving surface of the third substrate. A light sensing element extends within the third substrate. A transfer gate (TG) extends into a portion of the third substrate, extends adjacent the light sensing element, and is electrically connected to a first wiring structure within the second plurality of wiring structures. A floating diffusion (FD) region extends within the third substrate and adjacent the TG. The FD region is electrically connected to a second wiring structure within the second plurality of wiring structures.

20 Claims, 28 Drawing Sheets

(52) U.S. Cl.
CPC ..... *H10F 39/8053* (2025.01); *H10F 39/8063* (2025.01); *H10F 39/807* (2025.01); *H10F 39/811* (2025.01); *H10F 39/813* (2025.01); *H10F 39/12* (2025.01)

(56) References Cited

U.S. PATENT DOCUMENTS

| | | | | |
|---|---|---|---|---|
| 2021/0043671 | A1 | 2/2021 | Yoneda et al. | |
| 2021/0084249 | A1 | 3/2021 | Nakazawa et al. | |
| 2021/0343776 | A1* | 11/2021 | Nagahama | H10F 39/811 |
| 2021/0385403 | A1* | 12/2021 | Eki | H04N 25/00 |
| 2022/0005853 | A1 | 1/2022 | Hagimoto | |
| 2022/0037388 | A1 | 2/2022 | Takizawa et al. | |
| 2022/0077215 | A1 | 3/2022 | Horikoshi | |
| 2022/0262832 | A1* | 8/2022 | Okamoto | H01L 21/768 |
| 2022/0271069 | A1* | 8/2022 | Fukui | H10F 39/8037 |
| 2022/0353449 | A1* | 11/2022 | Ito | H10F 39/811 |
| 2023/0254608 | A1* | 8/2023 | Yamada | H10F 39/8037 250/208.1 |
| 2024/0258358 | A1 | 8/2024 | Nagahama | |

* cited by examiner 268
258
248
209
200
A'
201
III
266
256
246
II
210
264
242
I
202
203
203
270
264
232
222
210
A
D1
D3
D2

200
210
222
232
242
264
270
175
170
110
100
A
203
203
202
264
105
105
I
210
210
246
256
266
286
296
192
180
160
150
120
II
248
258
268
288
298
194
140
130
103
105
103
III
201
209
275
A'
D1
D3
D2

400
420
410
430
500
505
315
310
200
203
210
222
232
242
264
270
175
170
110
100
A
462
472
482
492
440
484
514
524
332
302
322
105
450
464
474
494
202
210
526
334
324
246
256
266
286
296
192
180
160
150
476
516
304
120
103
248
258
268
288
298
194
140
130
I
II
III
401
409
201
306
209
275
A'
D1
D2
D3

A
A'
I
II
III
D1
D2
D3
100
103
105
110
120
130
140
150
160
170
175
180
192
194
200
201
202
203
209
210
222
232
242
246
248
256
258
264
266
268
270
275
286
288
296
298
302
304
306
310
315
322
324
332
334
400
401
409
410
420
430
440
450
462
464
472
474
476
482
484
492
494
500
505
514
516
524
526

200
210
222
232
242
264
270
175
170
110
100
A
203
203
202
105
264
I
105
210
712
246
256
266
160
150
702
II
120
716
103
105
103
706
140
130
103
306
III
704
201
209
714
275
A'
D1
D3
D2

A
A'
I
II
III
D1
D2
D3

A
A'
I
II
III
D1
D2
D3

HIGHLY INTEGRATED IMAGE SENSORS USING INTER-SUBSTRATE WIRING STRUCTURES

REFERENCE TO PRIORITY APPLICATION

This application claims priority under 35 USC § 119 to Korean Patent Application No. 10-2022-0082419, filed Jul. 5, 2022, the disclosure of which is hereby incorporated herein by reference.

BACKGROUND

1. Field

Example embodiments relate to image sensors.

2. Description of the Related Art

As the electronic industry develops, the sizes of image sensors continue to decrease, and thus various studies have been performed in order to satisfy the need for higher integration of image sensors.

SUMMARY

Example embodiments provide an image sensor having improved characteristics.

According to example embodiments, there is provided a highly integrated image sensor. The image sensor may include a first substrate having a first transistor thereon, a first wiring on the first substrate, which is electrically connected to the first transistor, and second and third wirings on the first wiring. A second substrate is provided on the second and third wirings. The second substrate includes a second transistor therein, which is electrically connected to the second wiring. Fourth and fifth wirings are provided on the second substrate. A third substrate is provided on the fourth and fifth wirings. A color filter array layer, including color filters, is provided on the third substrate. A microlens is provided on the color filter array layer. A light sensing element is provided in the third substrate. A transfer gate (TG) is provided, which extends through a lower portion of the third substrate, and extends adjacent to the light sensing element, and is electrically connected to the fourth wiring. A floating diffusion (FD) region is provided at a lower portion of the third substrate adjacent to the TG and is electrically connected to the fifth wiring. A first through-electrode is provided, which extends through the second substrate, and is electrically connected to the second transistor and the fifth wiring. A second through-electrode is provided, which extends through the second substrate, and contacts the first and third wirings to be electrically connected to the fourth wiring.

According to example embodiments, there is provided an image sensor. The image sensor may include first, second and third substrates stacked in a vertically integrated manner, and commonly including a pixel region and a connection region surrounding the pixel region, and including connection wirings for transferring electrical signals in the vertical direction. A first transistor is provided within the second substrate in the pixel region. A first wiring is provided under the first transistor in the pixel region and is electrically connected to the first transistor. A second wiring is provided under the second substrate in the connection region. A first through-electrode extends through the second substrate in the pixel region, and is electrically connected to the first wiring. A second through-electrode extends through the second substrate in the connection region and is electrically connected to the second wiring. First and second adhesion pads are provided on the second substrate, and are electrically connected to the first and second through-electrodes, respectively, in the pixel region and the connection regions, respectively. Third and fourth wirings are provided on, and electrically connected to, the first and second adhesion pads, respectively. A light sensing element is provided in the third substrate. A transfer gate (TG) is provided, which extends through a lower portion of the third substrate, and is adjacent to the light sensing element in the pixel region, and is electrically connected to the fourth wiring. A floating diffusion (FD) region is provided at a lower portion of the third substrate, adjacent to the TG and is electrically connected to the third wiring. The fourth wiring may extend from the pixel region to the connection region, and may be formed in at least a portion of each of the pixel region and the connection region.

According to example embodiments, there is provided an image sensor. The image sensor may include first, second and third substrates stacked in a vertical direction, and commonly including a pixel region, a connection region surrounding the pixel region, and including connection wirings for transferring electrical signals in the vertical direction, and a pad region surrounding the connection region and including an I/O pad for receiving electrical signals from external the image sensor. A first transistor is provided on the first substrate in the pixel region. First and second wirings are provided on the first transistor, in the connection region and in the pad region. First and second adhesion pads are provided in the connection region and in the pad region, respectively. These first and second adhesion pads are electrically connected to the first and second wirings, respectively. Second to fourth transistors are provided beneath the second substrate in the pixel region. A third wiring is provided under the second transistor in the pixel region, and is electrically connected to the second transistor. A fourth wiring is provided under the second substrate in the connection region. A first through-electrode is provided, which extends through the second substrate in the pixel region and is electrically connected to the third wiring. A second through-electrode is provided, which extends through the second substrate in the connection region and is electrically connected to the fourth wiring. Third and fourth adhesion pads are provided on the second substrate, and are electrically connected to the first and second through-electrodes, respectively, in the pixel region and the connection regions, respectively. Fifth and sixth wirings are provided on, and electrically connected to, the third and fourth adhesion pads, respectively. A light sensing element is provided in the third substrate. A transfer gate (TG) is provided, which extends through a lower portion of the third substrate, and adjacent to the light sensing element in the pixel region, and is electrically connected to the sixth wiring. A floating diffusion (FD) region is provided at a lower portion of the third substrate adjacent to the TG, and is electrically connected to the fifth wiring. A color filter array layer (including color filters therein) is provided on the third substrate in the pixel region. A microlens is provided on the color filter array layer in the pixel region. The sixth wiring may extend from the pixel region to the connection region, and may be formed in at least a portion of each of the pixel region and the connection region.

According to a further embodiment, an image sensor is provided, which includes a first semiconductor substrate having a first transistor integrated therein, and a first plurality of wiring structures on the first semiconductor substrate. The first plurality of wiring structures include a first wiring structure electrically connected to a terminal of the first transistor. A second semiconductor substrate is provided on the first plurality of wiring structures. The second semiconductor substrate has a second transistor integrated therein, which includes a terminal that is electrically connected to a second wiring structure within the first plurality of wiring structures. A second plurality of wiring structures are provided on the second semiconductor substrate, and a third semiconductor substrate is provided on the second plurality of wiring structures. A microlens is provided on a light receiving surface of the third semiconductor substrate, and a light sensing element is provided within the third semiconductor substrate. A transfer gate (TG) is provided, which extends into a portion of the third semiconductor substrate. The transfer gate extends adjacent the light sensing element and is electrically connected to a first wiring structure within the second plurality of wiring structures. A floating diffusion (FD) region is provided, which extends within the third semiconductor substrate, and adjacent the transfer gate. The floating diffusion region is electrically connected to a second wiring structure within the second plurality of wiring structures. A first through-electrode is provided, which extends through the second semiconductor substrate and is electrically connected to the second transistor. A second through-electrode is provided, which extends through the second semiconductor substrate and electrically connects a wiring structure within the second plurality of wiring structures to a wiring structure within the first plurality of wiring structures.

In the image sensor in accordance with example embodiments, the degrees of freedom of space for forming wirings on the substrate, which are to be electrically connected to the source follower transistor, the select transistor and the reset transistor, may increase so that the wirings may be efficiently arranged and the integration degree of the image sensor may be increased.

DESCRIPTION OF EMBODIMENTS

Pixel division structures, image sensors including the pixel division structures and methods of manufacturing the image sensors in accordance with example embodiments will be more clearly understood from the following detailed description taken in conjunction with the accompanying drawings.

It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

In addition, first to four regions I, II, III and IV may refer to only an inside of a reference substrate, a first substrate and/or a second substrate. Alternatively, the first to four regions I, II, III and IV may also refer to spaces over and under the reference substrate, the first substrate and/or the second substrate. A direction substantially parallel to the reference substrate or the first substrate and/or the second substrate may be referred to as a horizontal direction, and a direction substantially perpendicular to the surface of the reference substrate or the first substrate and/or the second substrate may be referred to as a vertical direction. In the specification, up versus down, on and over versus beneath, and under, upper surface versus lower surface, and upper portion versus lower portion are relative conceptions so as to describe opposite sides in the vertical direction, and each wording may have opposite meanings according to the specific parts to be explained in the specifications.

Figure 1:
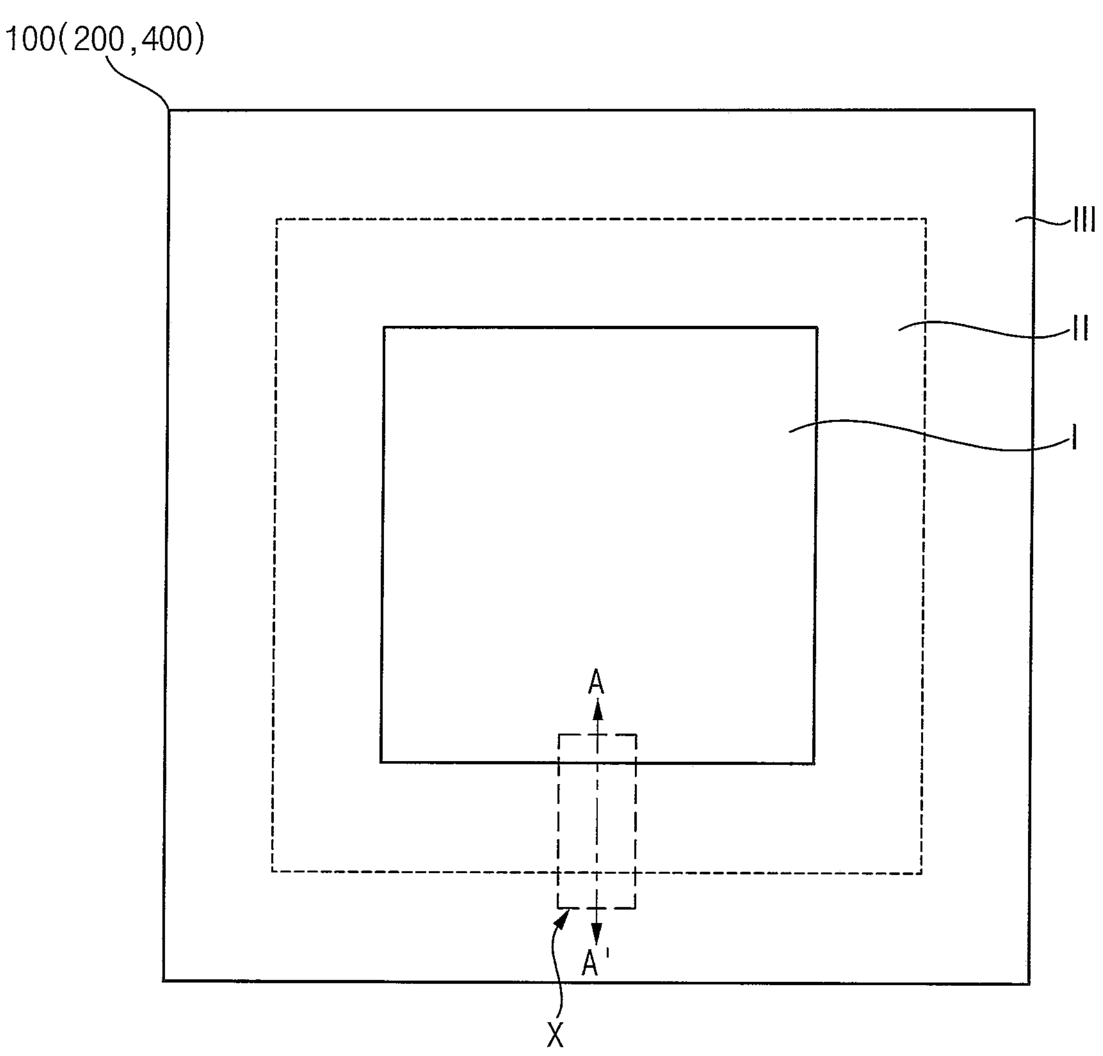
FIG. 1 is a plan view illustrating regions of an image sensor in accordance with example embodiments.
Figure 2:
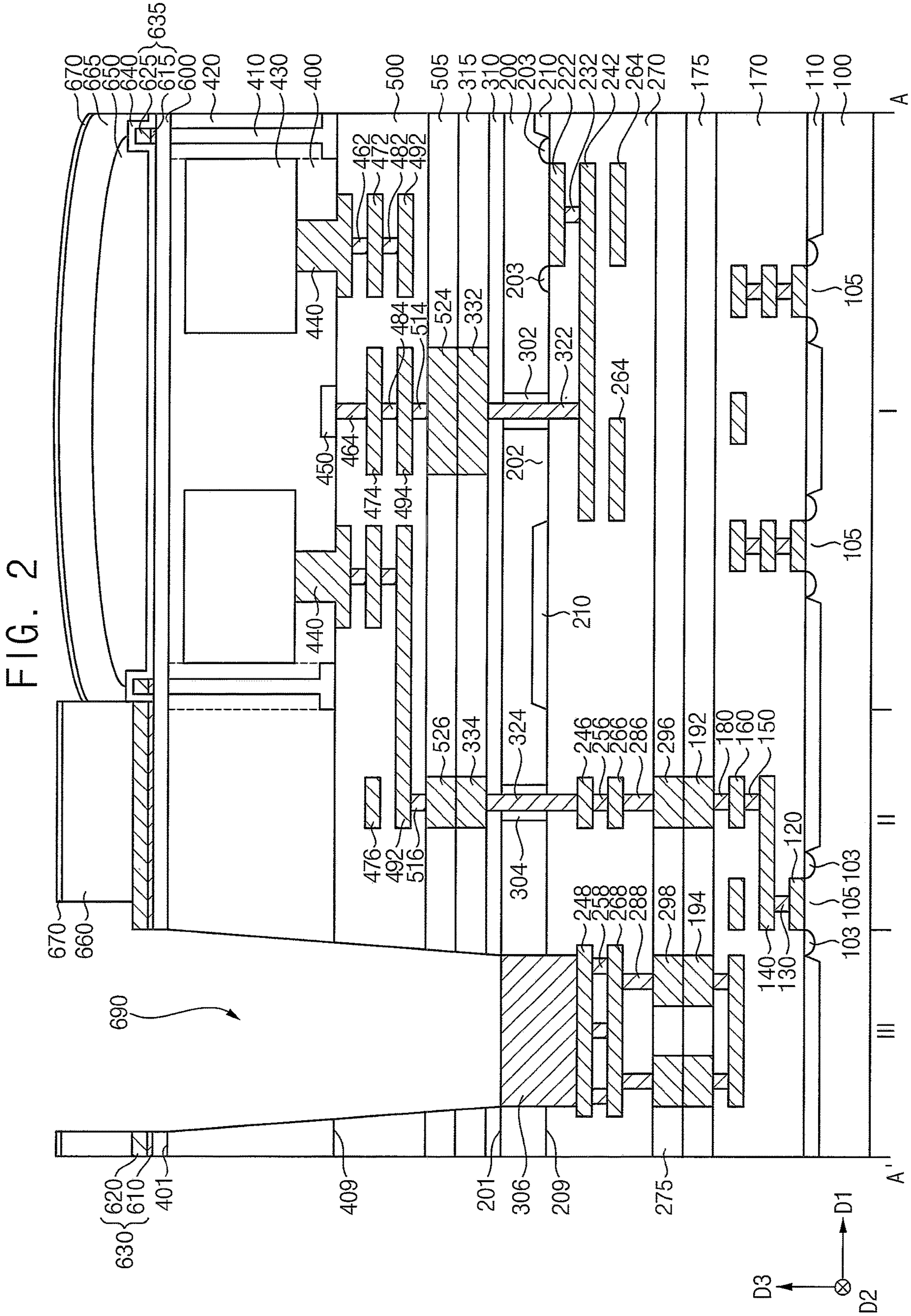
FIG. 2 is a cross-sectional view illustrating a portion of the image sensor of FIG. 1.

FIG. 1 is a plan view illustrating regions of an image sensor in accordance with example embodiments, and FIG. 2 is a cross-sectional view illustrating the image sensor. Referring to FIG. 1, the image sensor may include first, second and third regions I, II and III. In example embodiments, the first region I may be a pixel region in which pixels are formed, the second region II may be a connection region in which connection wirings for transferring electrical signals in the vertical direction, that is, the third direction D3 are formed, and the third region III may be a pad region in which input/output pads for receiving electrical signals from an outside are formed. In example embodiments, the second region II may surround the first region I, and the third region III may surround the second region II, however, the inventive concept is not limited thereto. For example, the second region II may not entirely surround the first region I, but may be formed at one side or opposite sides of the first region I, and the third region III may not entirely surround the second region II, but may be formed at one side or opposite sides of the second region II. Hereinafter, the drawings show only region X in the first to third regions I, II and III.

Referring to FIG. 2, the image sensor may include first, second and third substrates 100, 200 and 400 sequentially stacked in the third direction D3. Each of the first to third substrates 100, 200 and 400 may include a semiconductor material, such as silicon, germanium, silicon-germanium, or a III-V group compound semiconductor, such as GaP, GaAs, or GaSb. In some embodiments, at least one of the first to third substrates 100, 200 and 400 may be a silicon-on-insulator (SOI) substrate or a germanium-on-insulator (GOI) substrate.

In example embodiments, the third substrate 400 may be a substrate on which elements for receiving light and converting the light into electronic signals are formed, the second substrate 200 may be a substrate on which elements for converting the electronic signals into voltage signals are formed, and the first substrate 100 may be a substrate on which logic circuit patterns for processing electrical signals (e.g., the electronic signals, the voltage signals, etc.) are formed.

Thus, logic circuit patterns may be formed in the first to third regions I, II and III on the first substrate 100, and for example, a first transistor included in the logic circuit patterns is shown in FIG. 2. A first isolation pattern 110 may be formed on the first substrate 100, and a first active pattern 105 of which a sidewall is surrounded by the first isolation pattern 110 may be defined on the first substrate 100. The first transistor may include a first gate electrode 120 on the first substrate 100, and first impurity regions 103 at upper portions of the first active pattern 105 adjacent thereto.

A first insulating interlayer 170 may be formed on the first substrate 100, and contact plugs, vias and wirings may be formed in the first insulating interlayer 170. FIG. 2 shows a first contact plug 130, a first wiring 140, a first via 150, a second wiring 160 and a second via 180 are sequentially stacked on the first gate electrode 120 in the third direction D3, however, the inventive concept is not limited thereto.

In example embodiments, first and second adhesion layers 175 and 275 may be stacked on the first insulating interlayer 170 in the third direction D3. First and second adhesion pads 192 and 194 may extend through the first adhesion layer 175 to contact second vias 180 in the second and third regions II and III, respectively, and third and fourth adhesion pads 296 and 298 may extend through the second adhesion layer 275 to contact the first and second adhesion pads 192 and 194, respectively, in the second and third regions II and III.

The first and second adhesion layers 175 and 275 stacked in the third direction D3 may collectively form a first adhesion layer structure, the first and third adhesion pads 192 and 296 stacked in the third direction D3 may collectively form a first adhesion pad structure, and the second and fourth adhesion pads 194 and 298 stacked in the third direction D3 may collectively form a second adhesion pad structure.

A second insulating interlayer may be formed between the second adhesion layer 275 and the third and fourth adhesion pads 296 and 298, and the second substrate 200. The second substrate 200 may have first and second surfaces 201 and 209 opposite in the third direction D3, and FIG. 2 shows that the first and second surfaces 201 and 209 are upper and lower surfaces, respectively, of the second substrate 200. Thus, the second insulating interlayer 270 may contact the second surface 209 of the second substrate 200.

Figure 5:
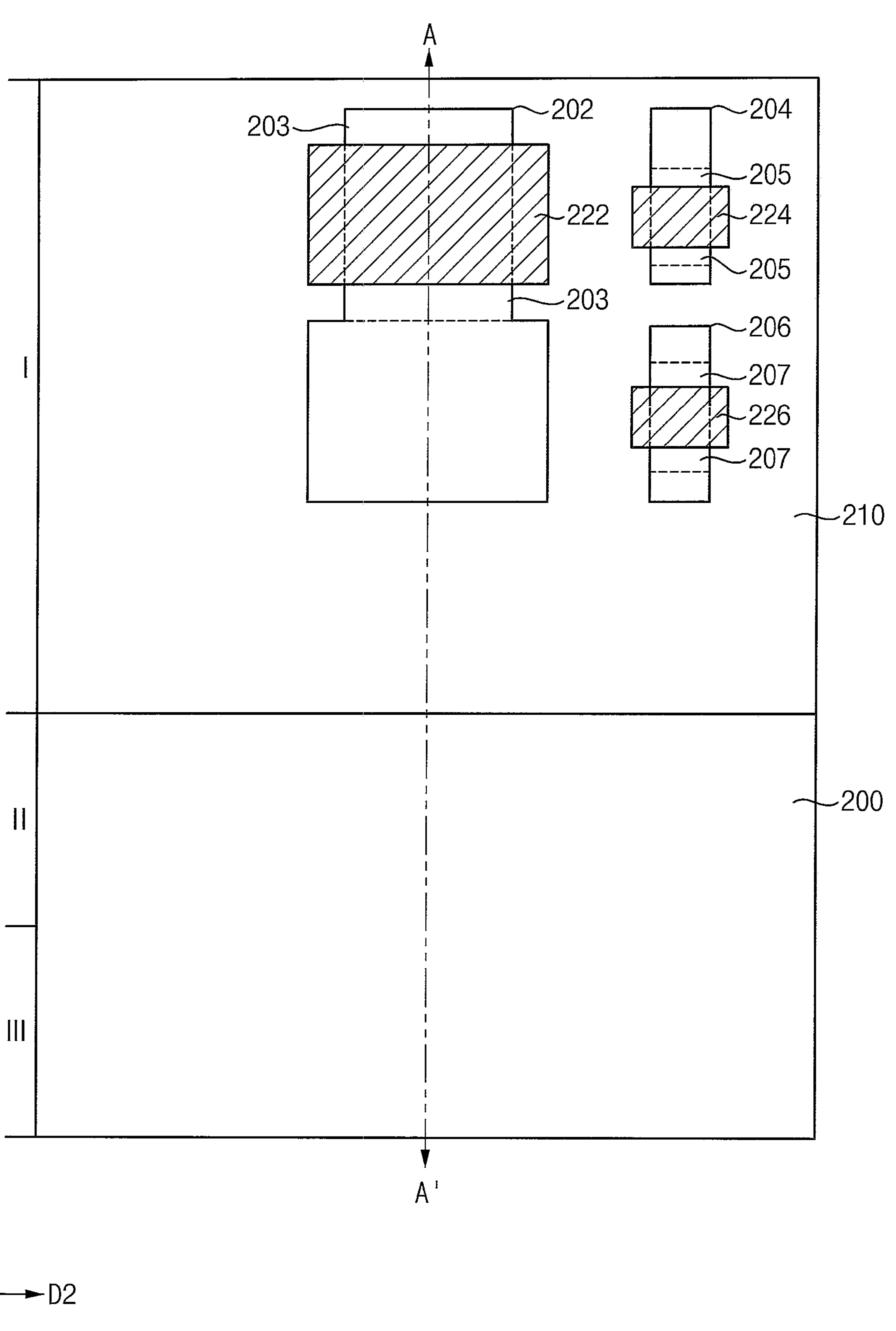

Referring to FIG. 5, in example embodiments, second, third and fourth transistors may be formed beneath the second substrate 200. In example embodiments, second, third and fourth active patterns 202, 204 and 206 of which sidewalls are surrounded by a second isolation pattern 210 may be formed in the first region I beneath the second substrate 200.

The second transistor may include a second gate electrode 222 beneath the second surface 209 of the second substrate 200, and second impurity regions 203 at lower portions of the second active pattern 202 adjacent thereto, the third transistor may include a third gate electrode 224 beneath the second surface 209 of the second substrate 200, and third impurity regions 205 at lower portions of the third active pattern 204 adjacent thereto, and the fourth transistor may include a fourth gate electrode 226 beneath the second surface 209 of the second substrate 200, and fourth impurity regions 207 at lower portions of the fourth active pattern 206 adjacent thereto.

In example embodiments, the second transistor may be a source follower (SF) transistor, the third transistor may be a select transistor, and the fourth transistor may be a reset transistor. In other embodiments, the third and fourth transistors may be spaced apart from each other in the first direction D1, the second transistor may be spaced apart from the third and fourth transistors in the second direction D2, however, the inventive concept may not be limited thereto.

Contact plugs, vias and wirings may be formed in the second insulating interlayer 270. FIG. 2 shows a second contact plug 232 contacting the second gate electrode 222 and a third wiring 242 contacting the second contact plug 232 in the first region I, and fourth and fifth wirings 246 and 248 at the same level as that of the third wiring 232 in the second and third regions II and III.

FIG. 2 shows a sixth wiring 264 at a level lower than that of the third wiring 242 in the first region I, and seventh and eighth wirings 266 and 268 at the same level as that of the sixth wiring 264 in the second and third regions II and III. A third via 256 may be formed between and electrically connected to the fourth and seventh wirings 246 and 266, and a fourth via 258 may be formed between and electrically connected to the fifth and eighth wirings 248 and 268.

A fifth via 286 may be formed between and electrically connected to the seventh wiring 266 and the third adhesion pad 296 in the second region II, and a sixth via 288 may be formed between and electrically connected to the eighth wiring 268 and the fourth adhesion pad 298 in the third region III. However, the inventive concept may not be limited to the above description, because more numbers of contact plugs, vias and wirings may be formed in the second insulating interlayer 270.

In another example embodiment, an input/output (I/O) pad 306 may be formed through the second substrate 200 and an upper portion of the second insulating interlayer 270 to contact the fifth wiring 248 in the third region III. The I/O pad 306 may be connected to an outer circuit by wiring bonding, for example, so as to receive electrical signals therefrom.

A third insulating interlayer 310 may be formed on the first surface 201 of the second substrate 200. A first through-electrode 322 may be formed through the second substrate 200, the third insulating interlayer 310 and an upper portion of the second insulating interlayer 270 to contact the third wiring 242 in the first region I, however, the first through-electrode 322 may be electrically insulated from the second substrate 200 by a first insulation pattern 302 in the second substrate 200. Additionally, a second through-electrode 324 may be formed through the second substrate 200, the third insulating interlayer 310 and an upper portion of the second insulating interlayer 270 to contact the fourth wiring 246 in the second region II, however, the second through-electrode 324 may be electrically insulated from the second substrate 200 by a second insulation pattern 304 in the second substrate 200.

In example embodiments, third and fourth adhesion layers 315 and 505 may be stacked in the third direction D3 on the third insulating interlayer 310 and the first and second through-electrodes 322 and 324. Fifth and sixth adhesion pads 332 and 334 may be formed through the third adhesion layer 315 to contact the first and second through-electrodes 322 and 324, respectively, in the first and second regions I and II, respectively, and seventh and eighth adhesion pads 524 and 526 may be formed through the fourth adhesion layer 505 to contact the fifth and sixth adhesion pads 332 and 334, respectively, in the first and second regions I and II, respectively.

The third and fourth adhesion layers 315 and 505 stacked in the third direction D3 may collectively form a second adhesion layer structure, the fifth and seventh adhesion pads 332 and 524 stacked in the third direction D3 may collectively form a third adhesion pad structure, and the sixth and eighth adhesion pads 334 and 526 stacked in the third direction D3 may collectively form a fourth adhesion pad structure.

A fourth insulating interlayer 500 may be formed between the fourth adhesion layer 505 and the seventh and eighth adhesion pads 524 and 526, and the third substrate 400. The third substrate 300 may have first and second surfaces 401 and 409 opposite in the third direction D3, and FIG. 2 shows that the first and second surfaces 401 and 409 of the third substrate 300 are upper and lower surfaces, respectively, of the third substrate 400. Thus, the fourth insulating interlayer 500 may contact the second surface 409 of the third substrate 400.

In example embodiments, a pixel division structure 410 extending through the third substrate 400 in the third direction D3, a light sensing element 430 in each of unit pixel regions defined by the pixel division structure 410, a transfer gate (TG) 440 extending in the third direction D3 through a lower portion of the third substrate 400 to contact the light sensing element 430 and having a lower portion protruding from the second surface 409 of the third substrate 400 downwardly that may be covered by the fourth insulating interlayer 500, and a floating diffusion (FD) region 450 at a lower portion of the third substrate 400 adjacent to the TG 440 may be formed in the first region I. In further embodiments, a p-type well including p-type impurities may be formed in the third substrate 400.

Figure 12:
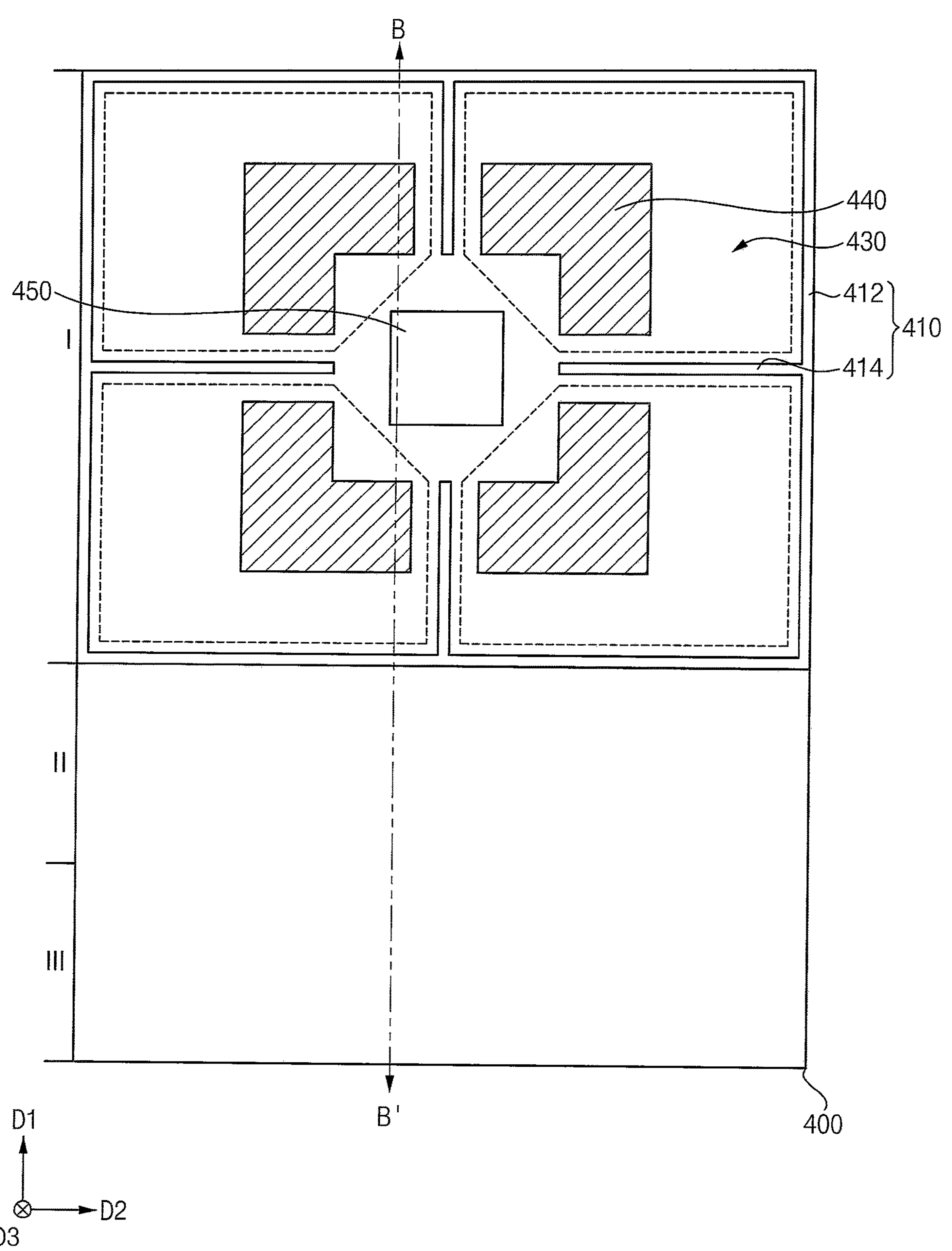

Referring to FIG. 2 together with FIG. 12, the pixel division structure 410 may extend in the third direction D3 from the second surface 409 to the first substrate 401 of the third substrate 400 in an inside of the first region I and at a boundary between the first and second regions I and II.

In example embodiments, the pixel division structure 410 may include a first pixel division pattern 412 having a shape of a polygon, such as a rectangle in a plan view, and second pixel division patterns 414 in a region defined by the first pixel division pattern 412 and extending from the first pixel division pattern 412 in the first direction D1 or in the second direction D2. Thus, the unit pixel regions in which unit pixels are formed may be defined by the first and second pixel division patterns 412 and 414 included in the pixel division structure 410 in the first region I of the third substrate 400. The unit pixel regions may be arranged in the first and second directions D1 and D2.

In example embodiments, each of the first and second pixel division patterns 412 and 414 may include a core extending in the third direction D3 and a shell covering a sidewall of the core. The core may include, for example, polysilicon doped with impurities or undoped polysilicon, and the shell may include an insulating material, such as silicon oxide, silicon nitride, etc. A fifth impurity region 420 including p-type impurities, e.g., boron may be formed at a portion of the third substrate 400 adjacent to the pixel division structure 410 in the first region I. An impurity concentration of the fifth impurity region 420 may be higher than that of the p-type well.

In example embodiments, the light sensing element 430 may be a portion of a photodiode (PD). The light sensing element 430 may be an impurity region doped with n-type impurities, e.g., phosphorus in the p-type well in the first region I of the third substrate 400, and thus the light sensing element 430 and the p-type well may form a PN junction diode. In example embodiments, the light sensing element 430 may be formed in each of the unit pixel regions defined by the first and second pixel division patterns 412 and 414.

The TG 440 may include a fifth gate electrode 440, and may include a buried portion extending from the second surface 409 of the third substrate 400 in the third direction D3 upwardly and a protrusion portion under the buried portion and having a bottom surface lower than the second surface 409 of the third substrate 400. In example embodiments, the TG 440 may be formed in each of the unit pixel region defined by the first and second pixel division patterns 412 and 414. In an example embodiment, the TG 440 may have an “L” shape that is concave toward a central portion between neighboring 4 unit pixel regions in a plan view.

The FD region 450 may be an impurity region doped with n-type impurities, e.g., phosphorus at a lower portion of the third substrate 400. In an example embodiment, the FD region 450 may be formed at a central portion between neighboring 4 unit pixel regions in a plan view, and thus may be surrounded by neighboring 4 TGs 440 in a plan view.

Contact plugs, vias and wirings may be formed in the fourth insulating interlayer 500. FIG. 2 shows third and fourth contact plugs 462 and 464 contacting the fifth gate electrode 440 and the FD region 450, respectively, and ninth and tenth wirings 472 and 474 contacting the third and fourth contact plugs 462 and 464, respectively, in the first region I, and an eleventh wiring 476 at the same level as that of the ninth and tenth wirings 472 and 474 in the second region II.

FIG. 2 shows twelfth and thirteenth wirings 492 and 494 under the ninth and tenth wirings 472 and 474 in the first region I. A seventh via 482 may be formed between the ninth wiring 472 and the twelfth wiring 492, and an eighth via 484 may be formed between the tenth wiring 474 and the thirteenth wiring 494. A ninth via 514 may be formed between the thirteenth wiring 494 and the seventh adhesion pad 524 in the first region I, and a tenth via 516 may be formed between the twelfth wiring 492 and the eighth adhesion pad 526 in the second region II.

In example embodiments, the twelfth wiring 492 may extend from a portion of the second region II to a portion of the third region III, and thus may be commonly formed in the second and third regions II and III. That is, the TG 440 in the first region I may be electrically connected to the tenth via 516 in the second region II through the third contact plug 462, the ninth wiring 472 and the seventh via 482 in the first region I and the twelfth wiring 492 in the first and second regions I and II. Additionally, the TG 440 may be electrically connected to wirings and vias under the second substrate 200 through the eighth adhesion pad 526, the sixth adhesion pad 334 and the second through-electrode 324. Further, the TG 440 may be electrically connected to the wirings, vias, contact plugs and the first transistor on the first substrate 100 through the wirings and the vias under the second substrate 200 and the first and third adhesion pads 192 and 296.

Figure 14:
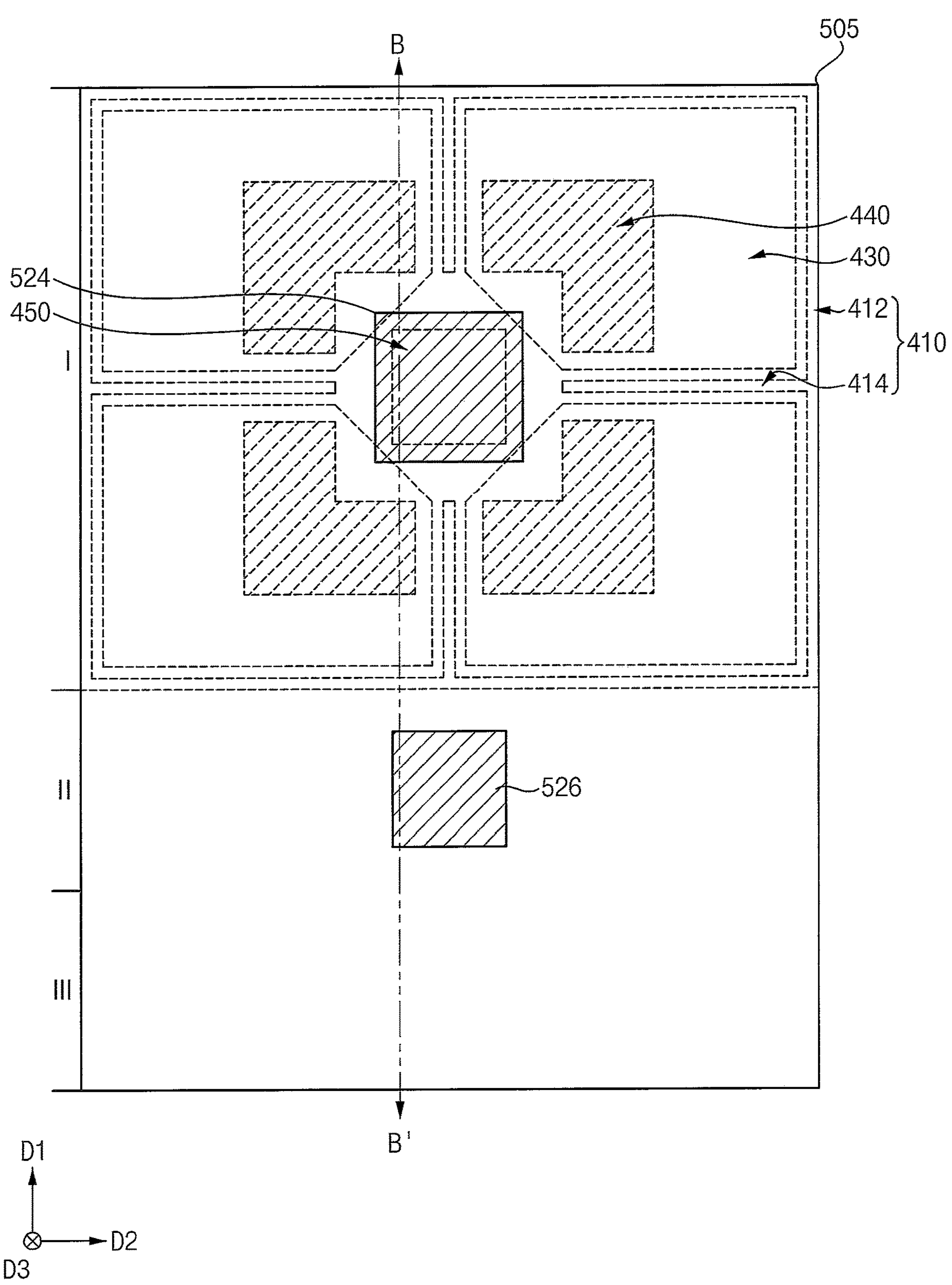

Referring to FIG. 2 together with FIG. 14, in example embodiments, the FD region 450 may be electrically connected to the second gate electrode 222 included in the source follower transistor at the lower portion of the second substrate 200 through the fourth contact plug 464, the tenth wiring 474, the eighth via 484, the thirteenth wiring 494, the ninth via 514, the seventh adhesion pad 524, the fifth adhesion pad 332, the first through-electrode 322, the third wiring 242 and the second contact plug 232. However, the inventive concept may not be limited to the above description, and more numbers of the contact plugs, vias and wirings may be formed in the fourth insulating interlayer 500. The first to fourth active patterns 105, 202, 204 and 206 may include a material substantially the same as that of the first to third substrates 100, 200 and 400, and the first and second isolation patterns 110 and 210 may include an oxide, such as silicon oxide.

The first to fifth gate electrodes 120, 222, 224, 226 and 440, the first to fourth contact plugs 130, 232, 462 and 464, the first to tenth vias 150, 180, 256, 258, 286, 288, 482, 484, 514 and 516, and the first to thirteenth wirings 140, 160, 242, 246, 248, 264, 266, 268, 472, 474, 476, 492 and 494 may include a conductive material, e.g., a metal, a metal nitride, a metal silicide, etc., the I/O pad 306 may include a metal, e.g., aluminum, and the first to fourth insulating interlayers 170, 270, 310 and 500 may include an oxide, such as silicon oxide.

The first to fourth adhesion layers 175, 275, 315 and 505 may include an insulating nitride, such as silicon nitride, and the first to eighth adhesion pads 192, 194, 296, 298, 332, 334, 524 and 526 may include a metal, such as copper.

In example embodiments, a lower planarization layer 600 may be formed on the first surface 401 of the third substrate 400 and the pixel division structure 410, a color filter array layer, a microlens 665 and a transparent protection layer 670 may be stacked on the lower planarization layer 600 in the first region I, and a light blocking metal layer 630, an upper planarization layer 660 and the transparent protection layer 670 sequentially stacked on the lower planarization layer 600 in the second and third regions II and III.

An interference blocking structure 635 between color filters 650 included in the color filter array layer and a protection layer 640 covering a surface of the interference blocking structure 635 on the lower planarization layer 600 may be formed in the first region I.

In an example embodiment, the lower planarization layer 600 may include first, second, third, fourth and fifth layers sequentially stacked in the third direction D3. The first, second, third, fourth and fifth layers may include, such as aluminum oxide, hafnium oxide, silicon oxide, silicon nitride, and hafnium oxide, respectively.

The interference blocking structure 635 may be formed on the lower planarization layer 600 to overlap the pixel division structure 410 in the third direction D3, and may have a lattice shape in a plan view. In example embodiments, the interference blocking structure 635 may include a first interference blocking pattern 615 and a second interference blocking pattern 625 stacked in the third direction D3. The first interference blocking pattern 615 may include a metal nitride, and the second interference blocking pattern 625 may include a metal. Alternatively, the second interference blocking pattern 625 may include a low refractive index material (LRIM). The protection layer 640 may include a metal oxide, such as aluminum oxide.

The color filter array layer may be formed on the protection layer 640, and may include a plurality of color filters 650. Sidewalls and bottom surfaces of the color filters 650 may be covered by the protection layer 640. For example, the color filters 650 may include a green color filter G, a blue color filter B and a red color filter R.

In example embodiments, the light blocking metal layer 630 may include a barrier pattern 600 and a first conductive pattern 610 stacked in the third direction D3. The barrier pattern 600 may include, e.g., a metal nitride, and the first conductive pattern 610 may include, e.g., a metal.

In example embodiments, the microlens 665 and the upper planarization layer 660 may include substantially the same material, e.g., a photoresist material having a high transmittance. The transparent protection layer 670 may include, such as SiO, SiOC, SiC, SiCN, etc.

A third opening 690 may be formed through the transparent protection layer 670, the upper planarization layer 660, the light blocking metal layer 630, the third substrate 400, the fourth insulating interlayer 500, and the third and fourth adhesion layers 315 and 505 to expose an upper surface of the I/O pad 306 in the third region III, and a conductive wire may be electrically connected to the I/O pad 306 through the third opening 690.

In the image sensor, the first insulating interlayer 170 containing wirings on the first substrate 100 and the second insulating interlayer 270 containing wirings beneath the second substrate 200 may be bonded with each other through the first and second adhesion layers 175 and 275 and the first to fourth adhesion pads 192, 194, 296 and 298. Additionally, the third insulating interlayer 310 containing wirings on the second substrate 200 and the fourth insulating interlayer 500 containing wirings beneath the third substrate 400 may be bonded with each other through the third and fourth adhesion layers 315 and 505 and the fifth to eighth adhesion pads 332, 334, 524 and 526.

In example embodiments, the source follower transistor beneath the second substrate 200 may be electrically connected to the FD region 450 at the lower portion of the third substrate 400 through the second contact plug 232 and the third wirings 242 contained in the second insulating interlayer 270 and the first through-electrode 322 extending through the upper portion of the second insulating interlayer 270 and the second substrate 200. Thus, wirings that may be electrically connected to other transistors, such as a select transistor or a reset transistor may be further formed under the third wiring 242 in the second insulating interlayer 270.

If the second and third substrates 200 and 400 are bonded with each other so that the second surface 209 of the second substrate 200 and the second surface 409 of the third substrate 400 face each other in the third direction D3, the second and fourth insulating interlayers 270 and 500 may be formed between the second and third substrates 200 and 400, and wirings for electrically connecting the source follower transistor and the FD region 450 are formed in a space over the source follower transistor in the second insulating inter layer 270, so that the space may not be used for forming other structures.

However, in example embodiments, the second and third substrates 200 and 400 may be bonded with each other so that the first surface 201 of the second substrate 200 and the second surface 409 of the third substrate 400 may face each other in the third direction D3, and the third wiring 242 for electrically connecting the source follower transistor and the FD region 450 to each other may be formed at a level close to the second surface 209 of the second substrate 200 in the second insulating interlayer 270. Thus, wirings, such as the sixth wiring 264 in FIG. 2 electrically connected to other transistors may be formed at levels far from the second surface 209 of the second substrate 200, that is, at levels lower than the third wiring 242 in the second insulating interlayer 270. As a result, the degrees of freedom of a space for forming wirings electrically connected to various transistors at the second substrate 200 may increase.

Figure 13:
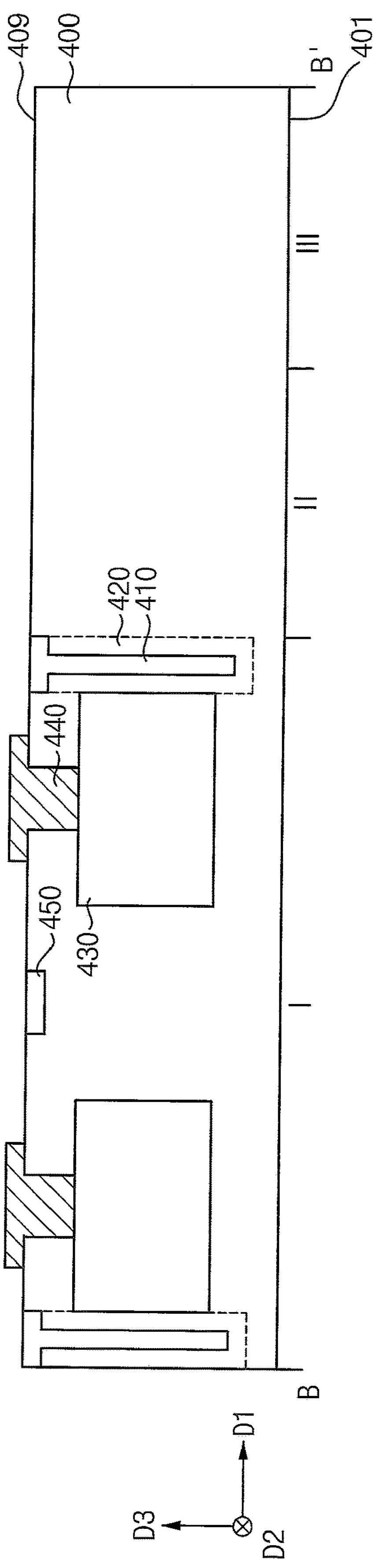
Figure 15:
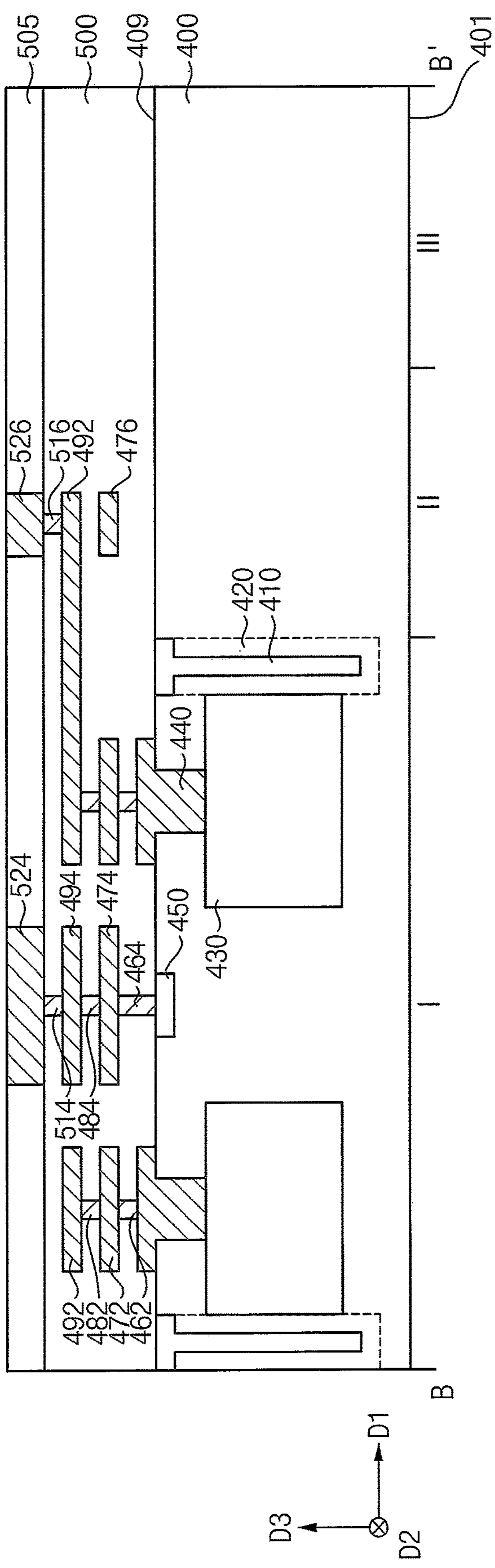

FIGS. 3 to 18 are plan views and cross-sectional views illustrating a method of manufacturing an image sensor in accordance with example embodiments. Particularly, FIGS. 5, 10, 12 and 14 are the plan views, and FIGS. 3-4, 6-9, 11, 13 and 15-18 are the cross-sectional views. FIGS. 6-9, 11 and 16-18 are cross-sectional views taken along lines A-A' of corresponding plan views, respectively, and FIGS. 13 and 15 are cross-sectional views taken along lines B-B' of corresponding plan views, respectively.

Figure 3:
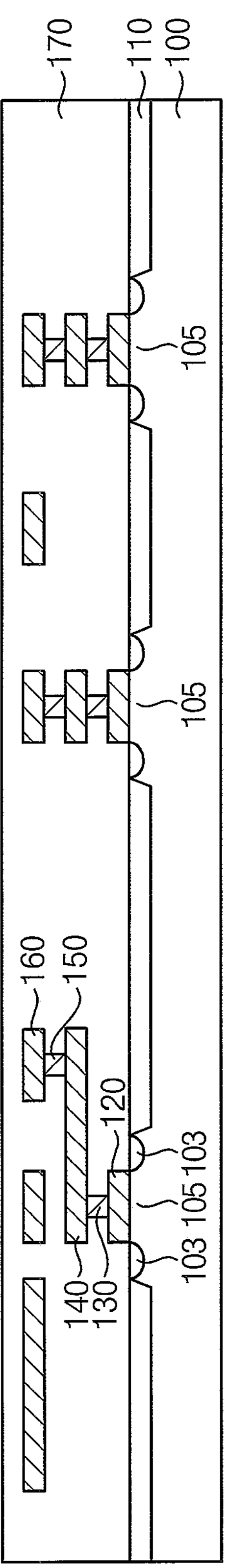
FIGS. 3 to 18 are plan views and cross-sectional views illustrating a method of manufacturing an image sensor in accordance with example embodiments.

Referring to FIG. 3, an upper portion of a first substrate 100 may be removed to form a first recess, and a first isolation pattern 110 may be formed in the first recess.

Thus, a first active pattern 105 of which a sidewall is covered by the first isolation pattern 110 may be formed on the first substrate 100. A first gate electrode 120 may be formed on the first active pattern 105, and impurities may be doped into upper portions of the first active pattern 105 adjacent to the first gate electrode 120 to form first impurity regions 103, respectively. The first gate electrode 120 and the first impurity regions 103 may collectively form a first transistor.

Contact plugs, vias and wirings electrically connected to the first transistor may be formed. FIG. 3 shows a first contact plug 130, a first wiring 140, a first via 150 and a second wiring 160 on the first transistor, however, the inventive concept may not be limited thereto. For example, in addition to the first and second wirings 140 and 160 at first and second levels, respectively, upper wirings may be further formed at a level or at a plurality of levels higher than the second level. A first insulating inter layer 170 may be formed on the first substrate 100 to cover the first transistor, the contact plugs, the vias and the wirings.

Figure 4:
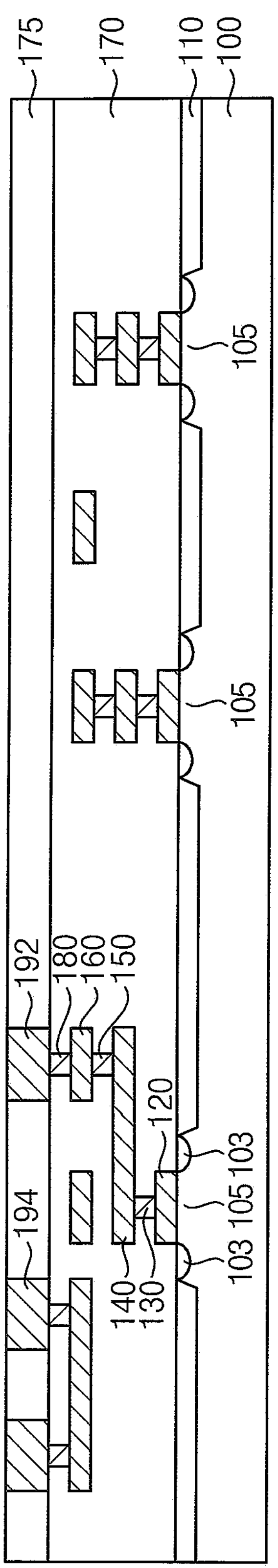

Referring to FIG. 4, second vias 180 may be formed through an upper portion of the first insulating interlayer 170 to contact upper surfaces of the second wirings 160, respectively, a first adhesion layer 175 may be formed on the first insulating interlayer 170 and the second vias 180, and first and second adhesion pads 192 and 194 may be formed through the first adhesion layer 175 to contact upper surfaces of the second vias 180, respectively.

Figure 6:
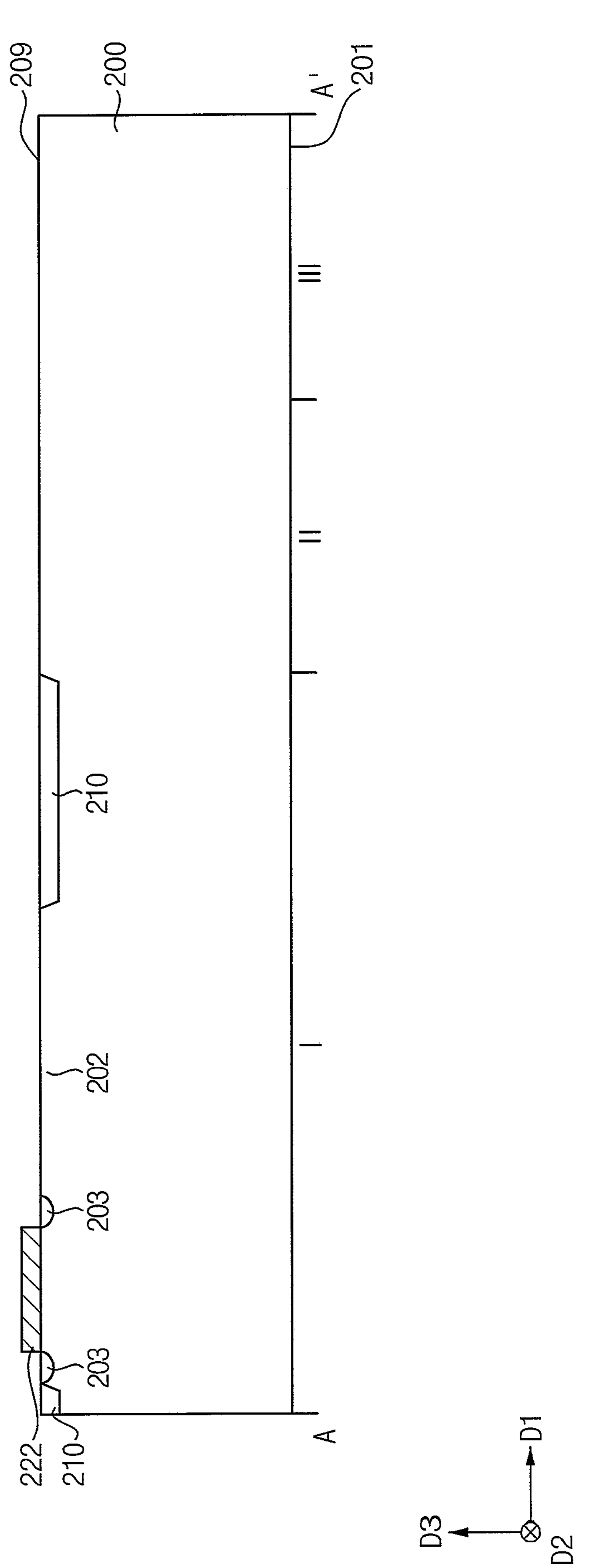

Referring to FIGS. 5 and 6, an upper portion of a second substrate 200 including first, second and third regions I, II and III to form a second recess, and a second isolation pattern 210 may be formed in the second recess. Thus, second, third and fourth active patterns 202, 204 and 206 of which sidewalls are covered by the second isolation pattern 210 may be formed on the second region II of the substrate 200.

Opposite surfaces of the second substrate 200 in the third direction D3 may be referred to as first and second surfaces 201 and 209, respectively. FIG. 6 shows the first and second surfaces 201 and 209 of the second substrate 200 are lower and upper surfaces, respectively, of the second substrate 200.

Second, third and fourth gate electrodes 222, 224 and 226 may be formed on the second to fourth active patterns 202, 204 and 206 and the second isolation pattern 210 in the first region I, and impurities may be doped into upper portions of the second to fourth active patterns 202, 204 and 206 adjacent to the second to fourth gate electrodes 222, 224 and 226, respectively, to form second, third and fourth impurity regions 203, 205 and 207, respectively.

In an example embodiment, the third and fourth gate electrodes 224 and 226 may be spaced apart from each other in the first direction D1, and the second gate electrode 222 may be spaced apart from the third and fourth gate electrodes 224 and 226 in the second direction D2.

The second gate electrode 222 and the second impurity regions 203 may form a second transistor, the third gate electrode 224 and the third impurity regions 205 may form a third transistor, and the fourth gate electrode 226 and the fourth impurity regions 207 may form a fourth transistor.

Figure 7:
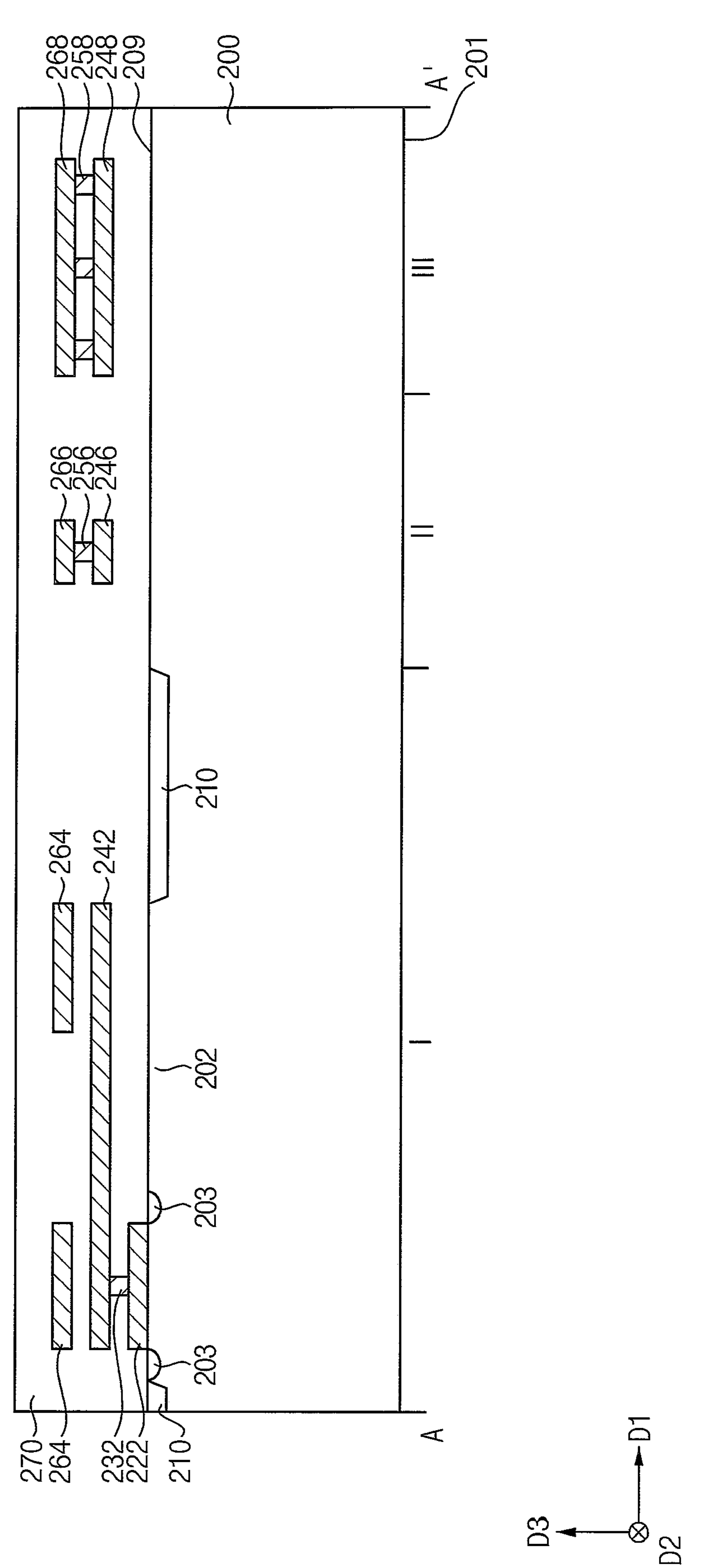

Referring to FIG. 7, contact plugs, vias and wirings electrically connected to the second to fourth transistors may be formed. FIG. 7 shows a second contact plug 232, third, fourth and fifth wirings 242, 246, 248, third and fourth vias 256 and 258, and sixth, seventh and eighth wirings 264, 266 and 268 on the second to fourth transistors. The second gate electrode 222, the second contact plug 232 and the third wiring 242 may be formed in the first region I to be electrically connected to each other, the fourth wiring 246, the third via 256 and the seventh wiring 266 may be formed in the second region II to be electrically connected to each other, and the fifth wiring 248, the fourth via 258 and the eighth wiring 268 may be formed in the third region III to be electrically connected to each other. However, the inventive concept may not be limited to the above description, and more numbers of the contact plugs, the vias and the wirings may be formed.

For example, in addition to the third to fifth wirings 242, 246 and 248 at a first level and the sixth to eighth wirings 264, 266 and 268 at a second level, upper wirings may be further formed at a level or a plurality of levels higher than the second level.

A second insulating interlayer 270 may be formed on the second substrate 200 to cover the second to fourth transistors, the contact plugs, the wirings and the vias.

Figure 8:
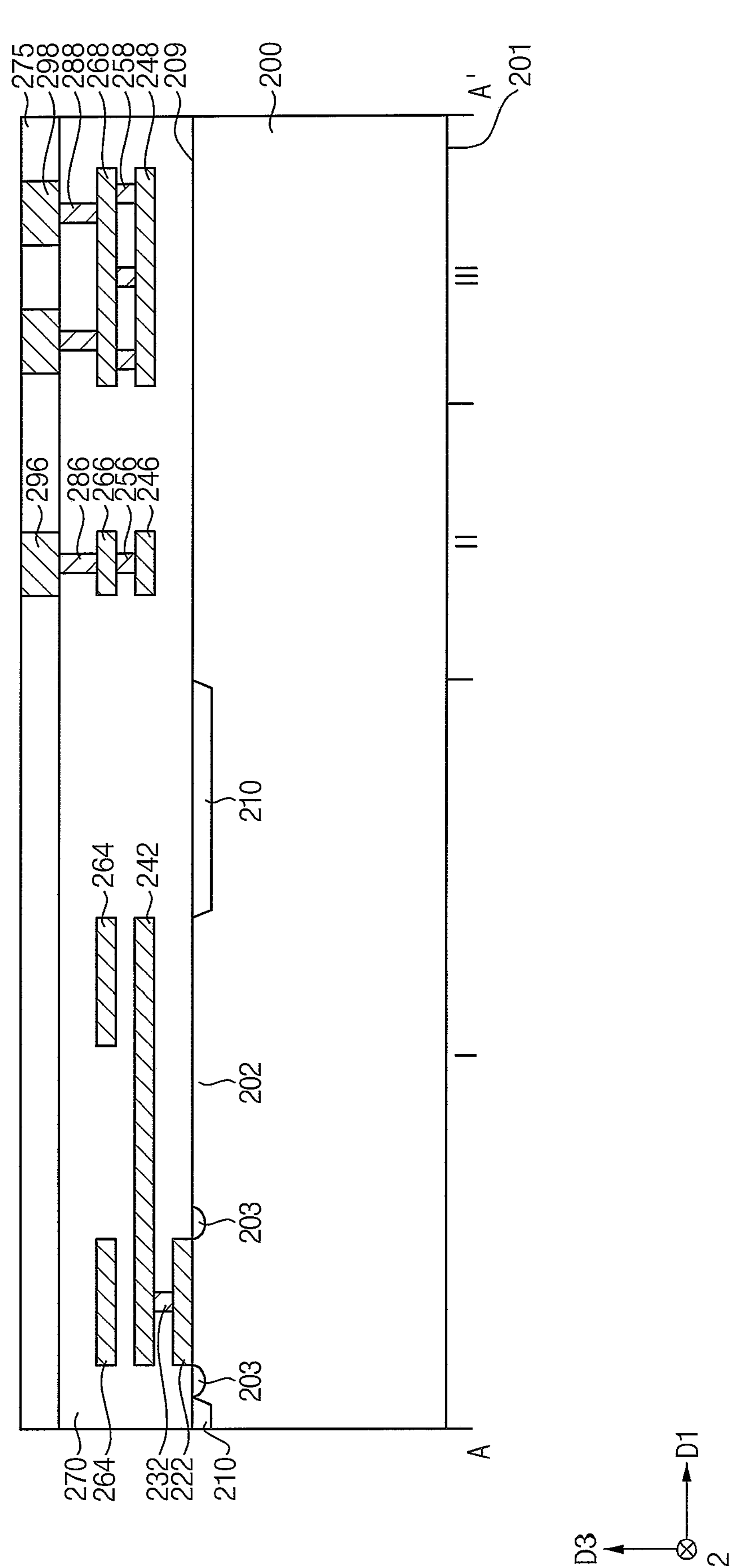

Referring to FIG. 8, fifth and sixth vias 286 and 288 may be formed through an upper portion of the second insulating interlayer 270 to contact upper surfaces of the seventh and eighth wirings 266 and 268, respectively, a second adhesion layer 275 may be formed on the second insulating interlayer 270 and the fifth and sixth vias 286 and 288, and third and fourth adhesion pads 296 and 298 may be formed through the second adhesion layer 275 to contact upper surfaces of the fifth and sixth vias 286 and 288, respectively. The third and fourth adhesion pads 296 and 298 may be formed in the second and third regions II and III, respectively.

Figure 9:
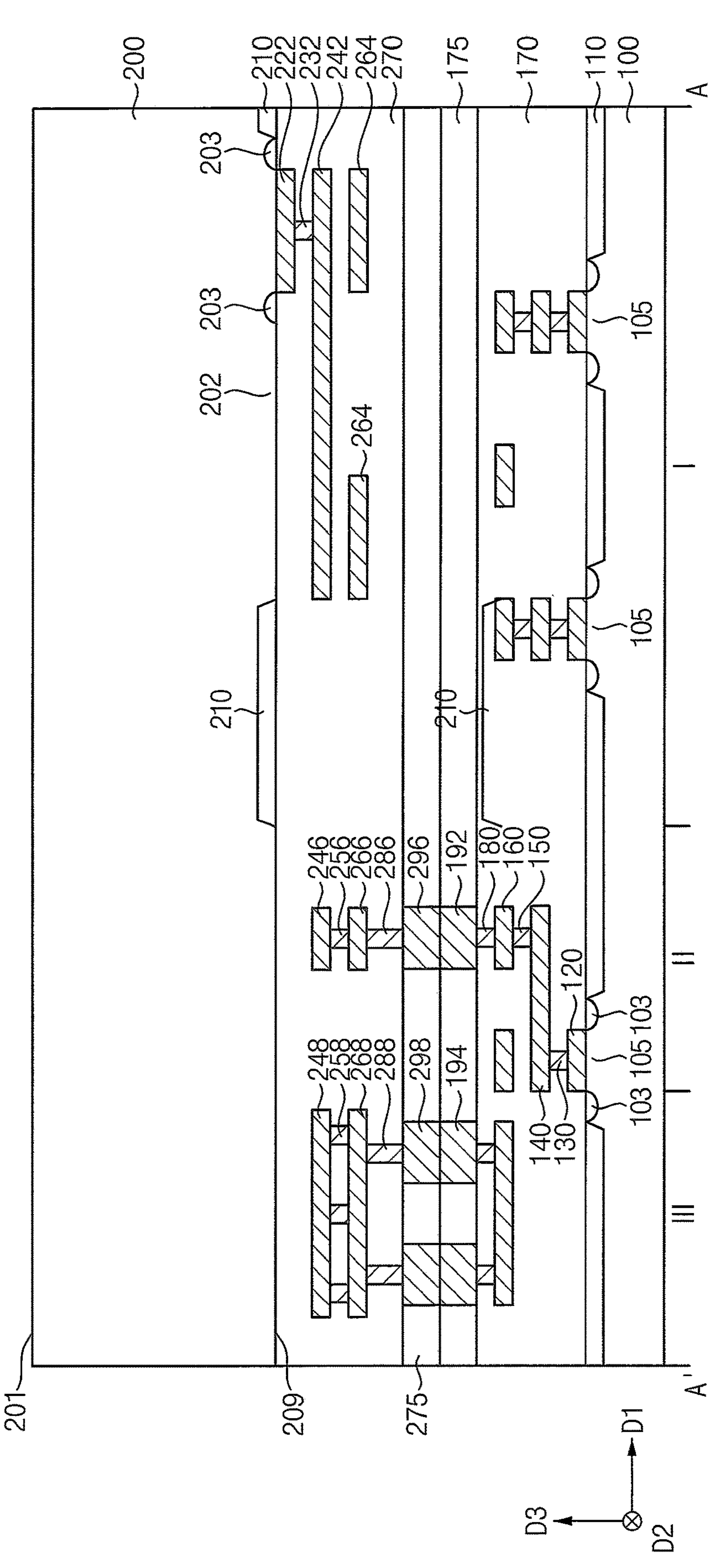

Referring to FIG. 9, the second substrate 200 may be overturned, and the first and second substrates 100 and 200 may be bonded with each other by contacting the second adhesion layer 275 and the first adhesion layer 175. During the bonding, the third and fourth adhesion pads 296 and 298 may contact the first and second adhesion pads 192 and 194, respectively.

Thus, the first and second surfaces 201 and 209 of the second substrate 200 may be shows as upper and lower surfaces, respectively, of the second substrate 200. Hereinafter, portions of the first substrate 100 corresponding to the first to third regions I, II and III of the second substrate 200 may also be referred to as first to third regions I, II and III of the first substrate 100.

Figure 10:
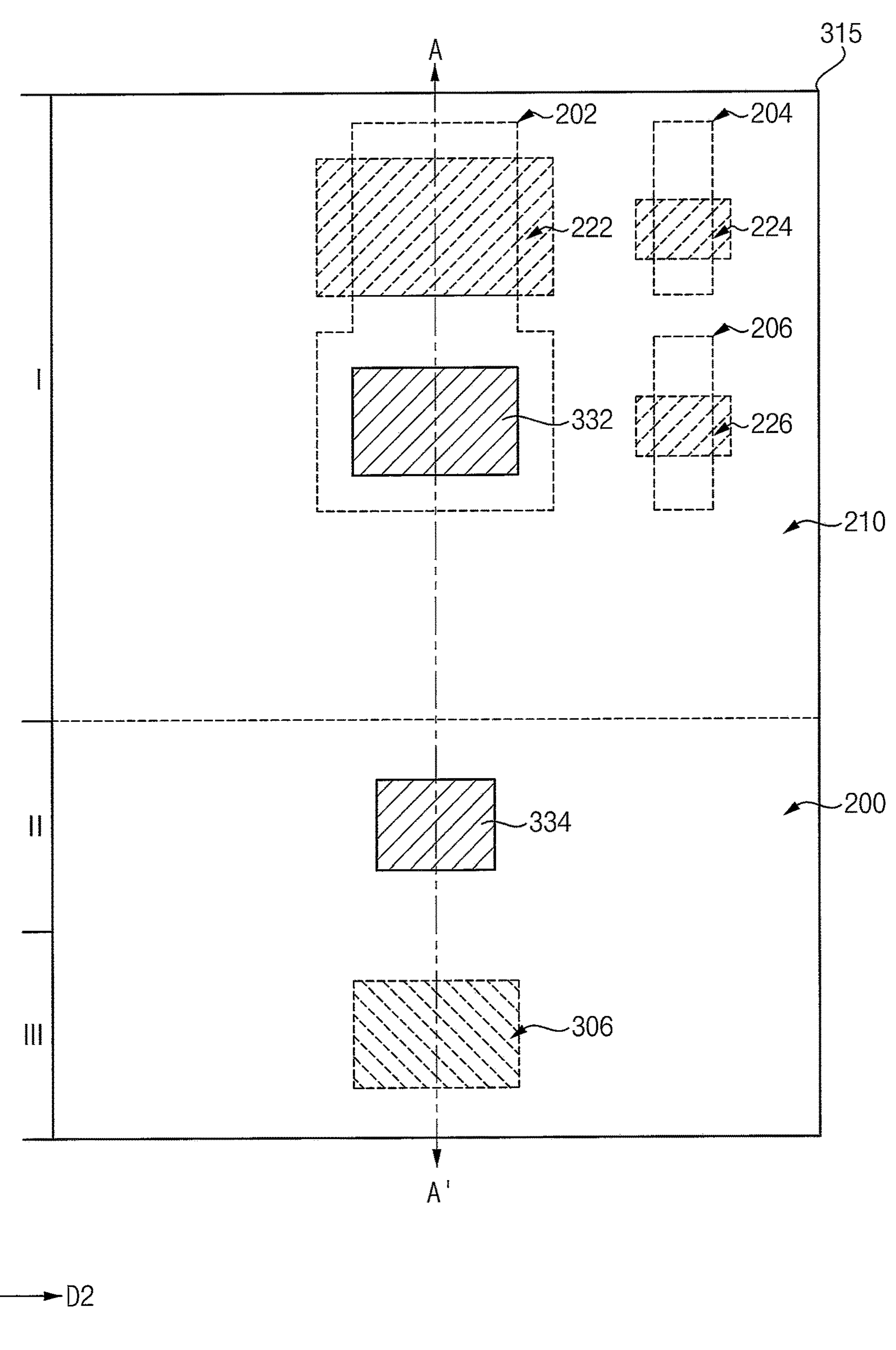
Figure 11:
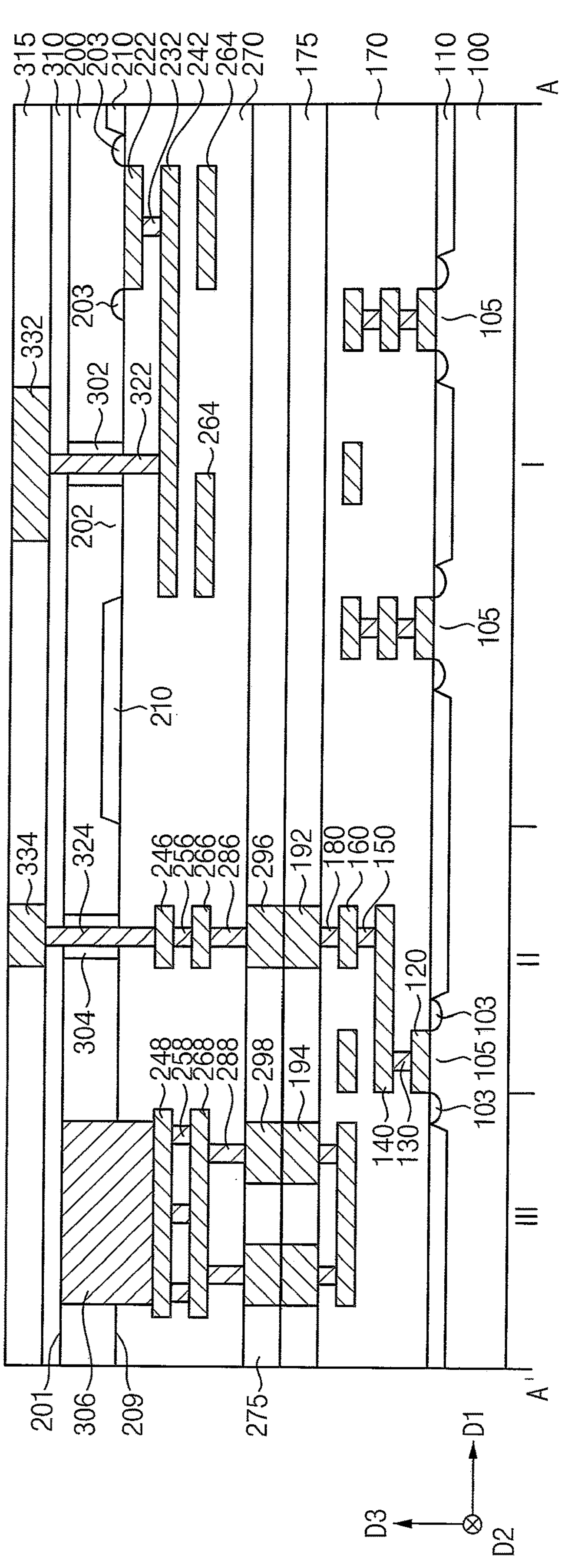

Referring to FIGS. 10 and 11, an upper portion of the second substrate 200 may be removed. For example, in some embodiments, the upper portion of the second substrate 200 may be removed by a polishing process, such as a grinding process, a CMP process, etc.

First and second insulation patterns 302 and 304 and an I/O pad 306 may be formed through the second substrate 200. In example embodiments, the first and second insulation patterns 302 and 304 may overlap the third and fourth wirings 242 and 246, respectively, in the third direction D3 in the first and second regions I and II, and the I/O pad 306 may overlap the fifth wiring 248 in the third direction D3 in the third region III.

A third insulating interlayer 310 may be formed on the first surface 201 of the second substrate 200, the first and second insulation patterns 302 and 304, and the I/O pad 306, and a first through-electrode 322 extending through the third insulating interlayer 310, the first insulation pattern 302 and an upper portion of the second insulating interlayer 270 to contact the third wiring 242 and a second through-electrode

324 extending through the third insulating interlayer 310, the second insulation pattern 304 and an upper portion of the second insulating interlayer 270 to contact the fourth wiring 246 may be formed.

A third adhesion layer 315 may be formed on the third insulating interlayer 310 and the first and second through-electrodes 322 and 324, and fifth and sixth adhesion pads 332 and 334 may be formed through the third adhesion layer 315 to contact the first and second through-electrodes 322 and 324, respectively. The fifth and sixth adhesion pads 332 and 334 may be formed in the first and second regions I and II, respectively.

Referring to FIGS. 12 and 13, a pixel division structure 410, a fifth impurity region 420 and a light sensing element 430 may be formed in the third substrate 400 including first, second and third regions I, II and III, and a fifth gate electrode 440 and a FD region 450 may be formed. Opposite surfaces of the third substrate 400 in the third direction D3 may be referred as first and second surfaces 401 and 409, respectively, of the third substrate 400. FIG. 13 shows that the first and second surfaces 401 and 409 are lower and upper surfaces, respectively, of the third substrate 400. In example embodiments, a p-type well doped with p-type impurities, such as boron may be formed in the third substrate 400

The pixel division structure 410 may extend in the third direction D3 from the second surface 409 to the first substrate 401 of the third substrate 400 downwardly in an inside of the first region I and at a boundary between the first and second regions I and II, and a portion of the third substrate 400 adjacent to the pixel division structure 410 may be doped with p-type impurities, such as boron, to form a fifth impurity region 420. An impurity concentration of the fifth impurity region 420 may be higher than that of the p-type well.

In example embodiments, the pixel division structure 410 may include a first pixel division pattern 412 having a shape of a polygon, e.g., a rectangle in a plan view, and second pixel division patterns 414 in a region defined by the first pixel division pattern 412 and extending from the first pixel division pattern 412 in the first direction D1 or in the second direction D2. Thus, unit pixel regions in which unit pixels are formed may be defined by the first and second pixel division patterns 412 and 414 included in the pixel division structure 410 in the first region I of the third substrate 400.

The light sensing element 430 may be formed by doping n-type impurities, e.g., phosphorus into the p-type well in the first region I of the third substrate 400. In example embodiments, the light sensing element 430 may be formed in each of the unit pixel regions defined by the first and second pixel division patterns 412 and 414.

The fifth gate electrode 440 may be formed by forming a trench extending in the third direction D3 from the second surface 409 of the third substrate 400 downwardly, and filling a conductive material in the trench to protrude from the second surface 409 of the third substrate 400 upwardly. In example embodiments, the fifth gate electrode 440 may be formed in each of the unit pixel regions defined by the first and second pixel division patterns 412 and 414.

N-type impurities, such as phosphorus dopants, may be added to an upper portion of the third substrate 400 adjacent to the fifth gate electrode 440 to form an FD region 450. In an example embodiment, the FD region 450 may be commonly formed in the neighboring 4 unit pixel regions, and thus may be surrounded by 4 fifth gate electrodes 440.

Referring to FIGS. 14 and 15, contact plugs, wirings and vias electrically connected to the fifth gate electrode 440 and the FD region 450 may be formed. FIGS. 14 and 15 show third and fourth contact plugs 462 and 464, ninth to eleventh wirings 472, 474 and 476, seventh and eighth vias 482 and 484, and twelfth and thirteenth wirings 492 and 494 on the fifth gate electrode 440 and the FD region 450.

The fifth gate electrode 440, the third contact plug 462, the ninth wiring 472 and the seventh via 482 may be formed on the first region I of the third substrate 400 to be electrically connected to each other, and the twelfth wiring 492 may be formed on the first and second regions I and II of the third substrate 400 to be electrically connected to the seventh via 482. The FD region 450, the fourth contact plug 464, the tenth wiring 474, the eighth via 484 and the thirteenth wiring 494 may be formed on the first region I of the third substrate 400 to be electrically connected to each other. The eleventh wiring 476 may be formed on the second region II of the third substrate 400. However, the inventive concept may not be limited to the above description, and a larger number of the contact plugs, the vias and the wirings may be formed. For example, in addition to the ninth to eleventh wirings 472, 474 and 476 at a first level and the twelfth and thirteenth wirings 492 and 494 at a second level, upper wirings may be further formed at a level or a plurality of levels higher than the second level.

A fourth insulating interlayer 500 may be formed on the third substrate 400 to cover the fifth gate electrode 440, the FD region 450, the contact plugs, the wirings and the vias. Ninth and tenth vias 514 and 516 may be formed through an upper portion of the fourth insulating interlayer 500 to contact upper surfaces of the thirteenth and twelfth wirings 494 and 492, respectively, a fourth adhesion layer 505 may be formed on the fourth insulating interlayer 500 and the ninth and tenth vias 514 and 516, and seventh and eighth adhesion pads 524 and 526 may be formed through the fourth adhesion layer 505 to contact upper surfaces of the ninth and tenth vias 514 and 516, respectively. The seventh and eighth adhesion pads 524 and 526 may be formed on the first and second regions I and II, respectively, of the third substrate 400.

Figure 16:
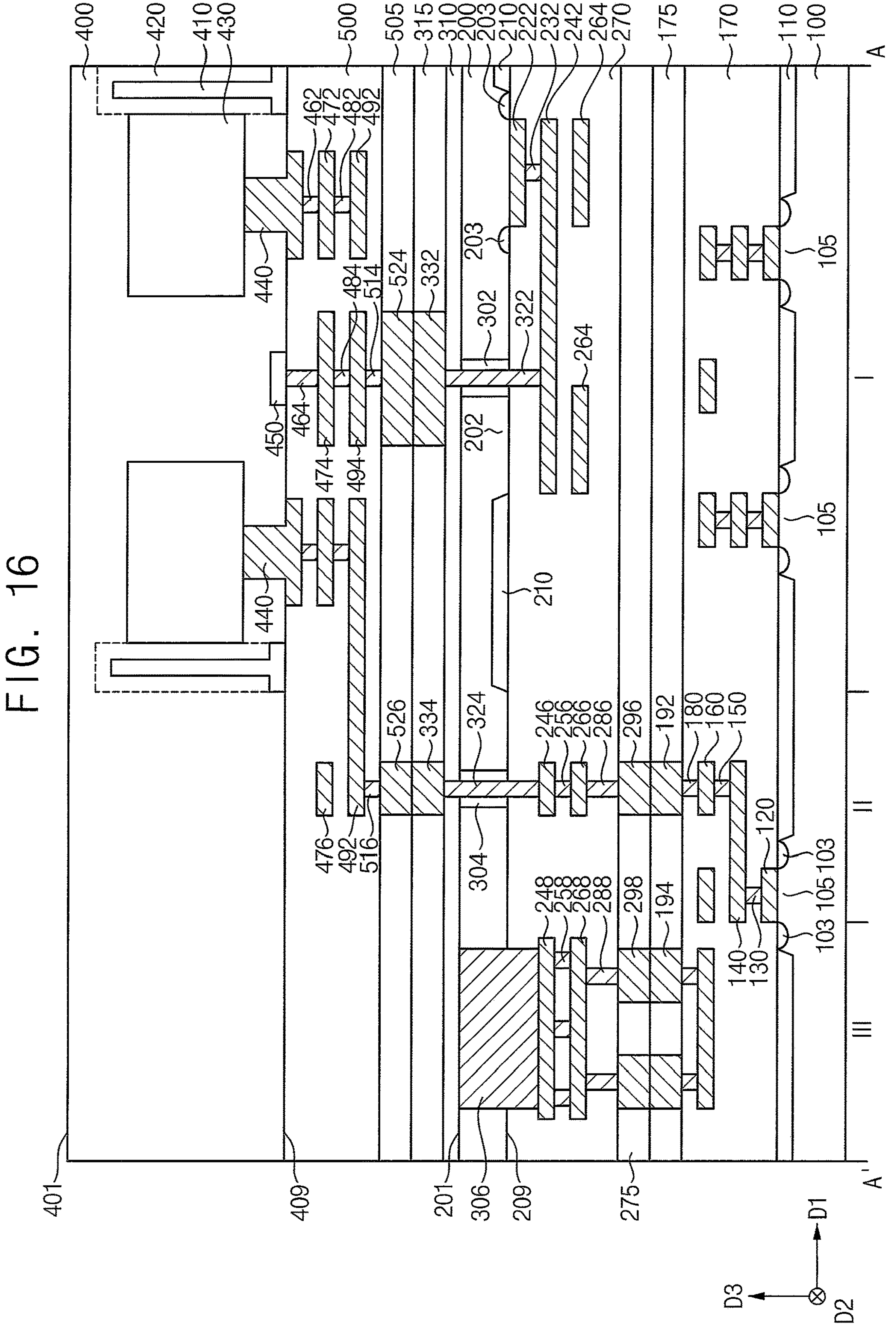

Referring to FIG. 16, the third substrate 400 may be overturned, and the second and third substrates 200 and 400 may be bonded with each other so that the fourth adhesion layer 505 and the third adhesion layer 315 may contact each other, and during the bonding, the seventh and eighth adhesion pads 524 and 526 may contact the fifth and sixth adhesion pads 332 and 334, respectively. FIG. 16 shows the first and second surfaces 401 and 409 of the third substrate 400 are upper and lower surfaces, respectively, of the third substrate 400. Hereinafter, the first to third regions I, II and III may be commonly used in the first to third substrates 100, 200 and 400.

Figure 17:
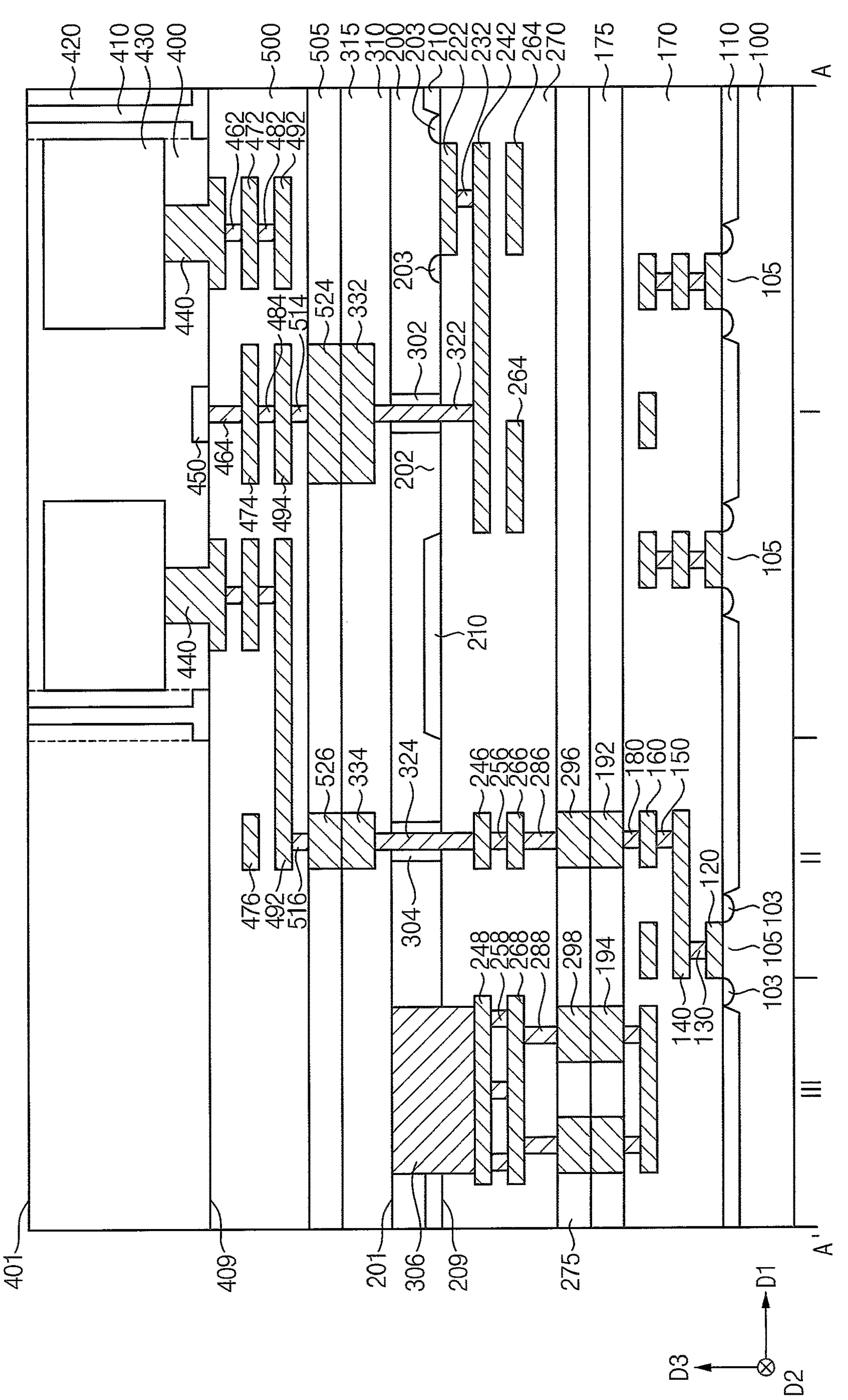

Referring to FIG. 17, an upper portion of the third substrate 400 may be removed by a polishing process, e.g., a grinding process, a CMP process, etc. Thus, an upper surface of the pixel division structure 410 may be exposed, and as a result, the pixel division structure 410 may extend through the third substrate 400.

Figure 18:
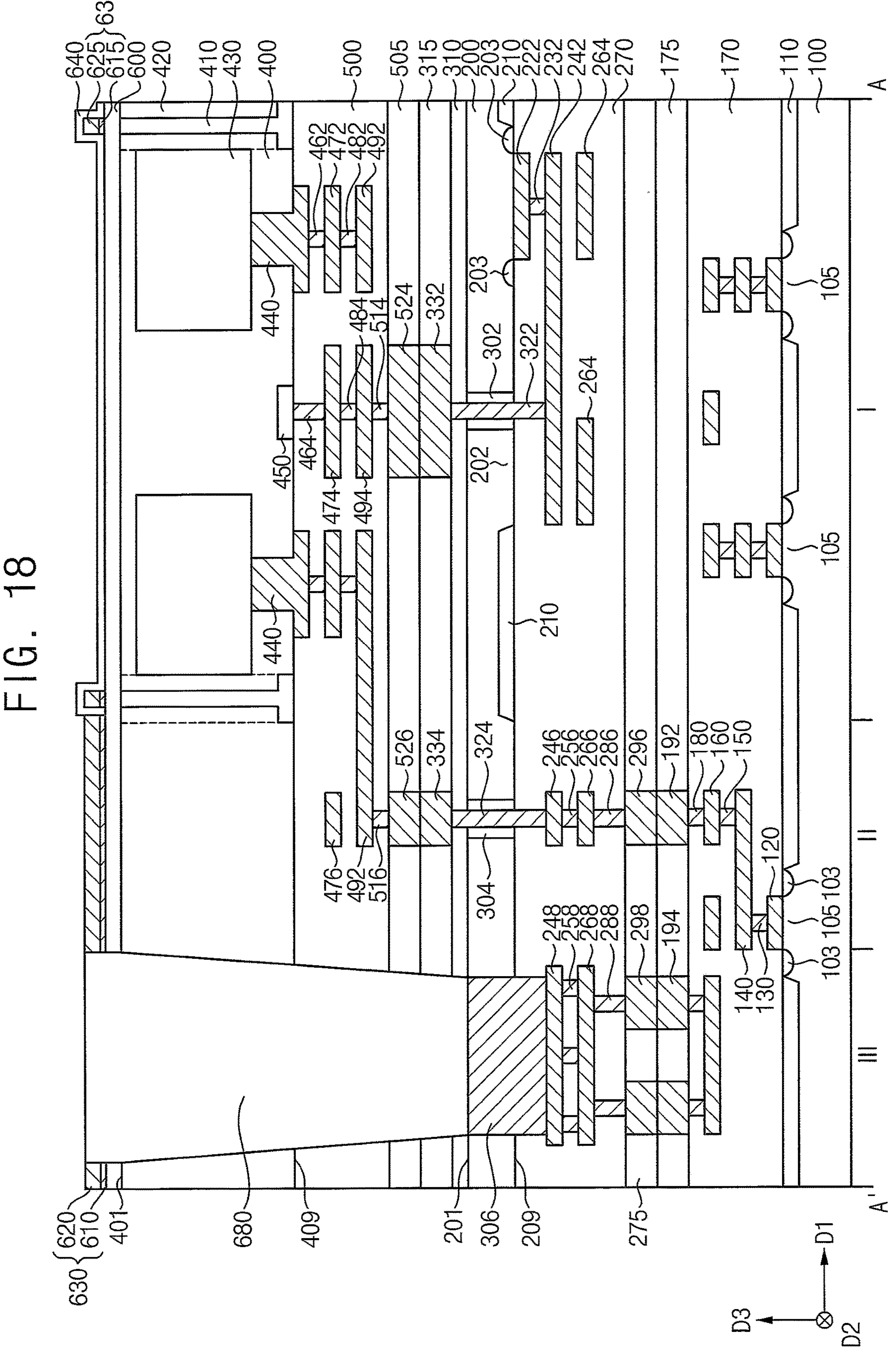

Referring to FIG. 18, a lower planarization layer 600 may be formed on the first surface 401 of the third substrate 400 and the pixel division structure 410. A barrier layer and a first conductive layer may be sequentially formed on an upper surface of the lower planarization layer 600, the first conductive layer, the barrier layer, the lower planarization layer 600, the third substrate 400, the fourth insulating interlayer 500, the third and fourth adhesion layers 315 and 505, and the third insulating interlayer 310 may be partially removed in the third region III to form a first opening exposing an upper surface of the I/O pad 306, a filling layer may be formed in the first opening, and an upper portion of the filling layer may be planarized until an upper surface of the first conductive layer is exposed. Thus, a filling pattern may be formed in the first opening in the third region III. The filling pattern 680 may include, e.g., silicon oxide, silicon nitride, spin-on-hardmask (SOH), amorphous carbon layer (ACL), etc. The planarization process may be performed using a CMP process and/or an etch back process.

Portions of the first conductive layer and the barrier layer in the first region I may be patterned to form a second interference blocking pattern 625 and a first interference blocking pattern 615, respectively, and portions of the first conductive layer and the barrier layer in the second region II may remain as a first conductive pattern 620 and a barrier pattern 610, respectively. The barrier pattern 610 and the first conductive pattern 620 may collectively form a light blocking metal layer 630, and the first and second interference blocking patterns 615 and 625 may collectively form an interference blocking structure 635. A protection layer 640 may be formed on the lower planarization layer 660 and the interference blocking structure 635 in the first region I.

Referring to FIG. 2 again, a color filter array layer including color filters 650 may be formed on the protection layer 640 in the first region I.

In example embodiments, the color filters 650 may be formed by depositing a color filter layer on the protection layer 640, the light blocking metal layer 630 and the filling pattern 680 through, e.g., a spin coating process, and performing an exposure process and a developing process on the color filter layer. In an example embodiment, each of the color filters 650 may be formed on each of the unit pixel regions defined by the first and second division patterns 412 and 414. Alternatively, each of the color filters 650 may be formed on neighboring ones of the unit pixel regions.

An upper planarization layer 660 may be formed on the color filter array layer, the protection layer 640, the light blocking metal layer 630 and the filling pattern 680, and a patterning process and a reflow process may be performed on the upper planarization layer 660 in the first region I to form a microlens 665.

A transparent protection layer 670 may be formed on the microlens 665 and the upper planarization layer 660, and a portion of the transparent protection layer 670 overlapping the filling pattern 680 in the third direction D3 in the third region III and portions of the upper planarization layer 660 and the light blocking metal layer 630 thereunder may be removed to form a second opening exposing an upper surface of the filling pattern 680. The filling pattern 680 may be removed through the second opening to form a third opening 690 exposing the I/O pad 306, and for example, a conductive wire may be formed through the third opening 690 to be electrically connected to the I/O pad 306 to complete the fabrication of the image sensor.

Figure 19:
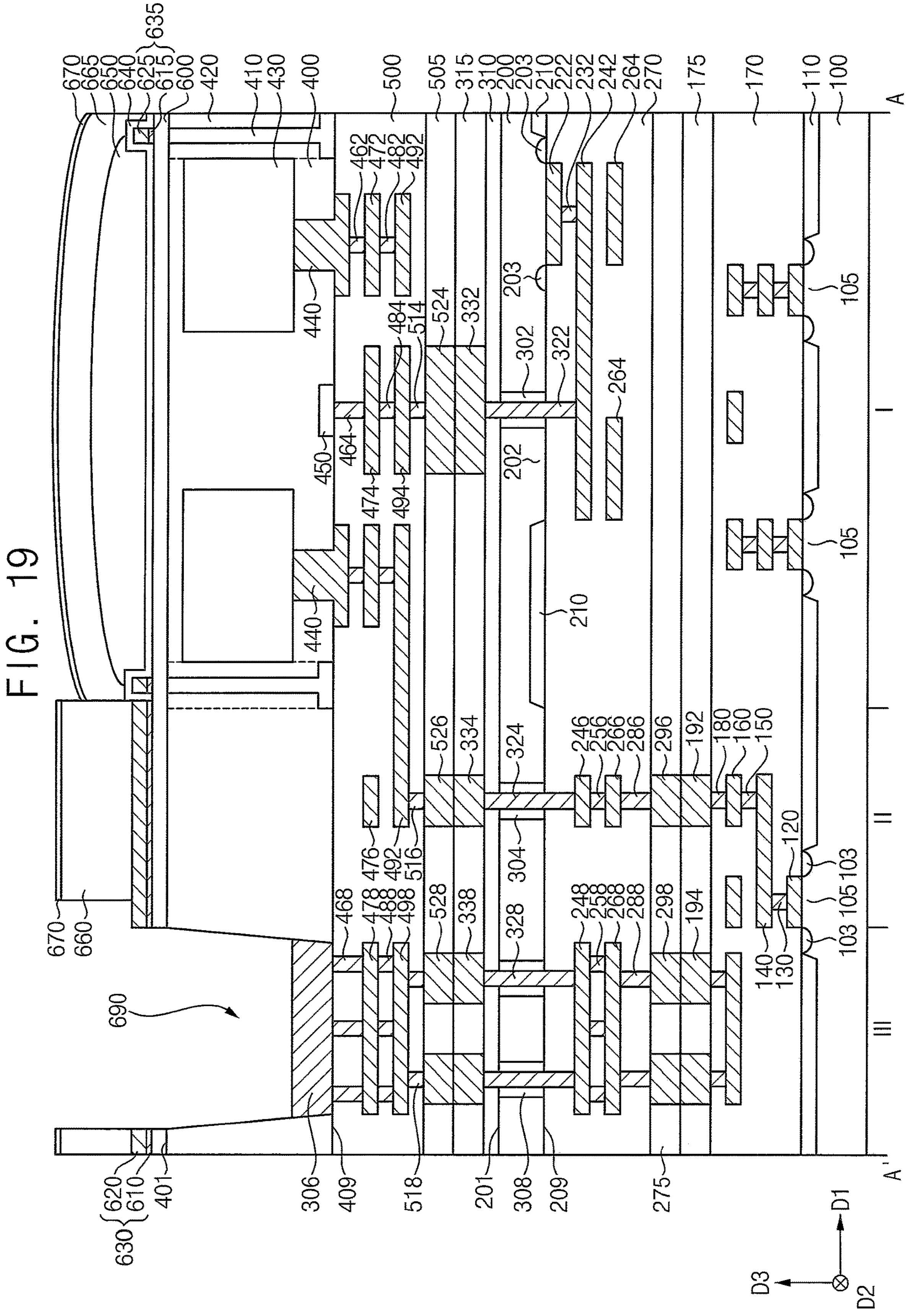
FIG. 19 is a cross-sectional view illustrating an image sensor in accordance with example embodiments.

FIG. 19 is a cross-sectional view illustrating an image sensor in accordance with example embodiments. This image sensor may be substantially the same as or similar to that of FIGS. 1 and 2, except for some elements, and thus, repeated explanations thereof are omitted herein.

Referring to FIG. 19, the I/O pad 306 may extend through the third substrate 400 instead of the second substrate 200. In the third region III, a fifth contact plug 468, a fourteenth wiring 478, an eleventh via 488, a fifteenth wiring 498 and a twelfth via 518 covered by the fourth insulating interlayer 500 may be further formed, ninth and tenth adhesion layers 315 and 505 extending through the third and fourth adhesion layers 315 and 505 may be further formed, and a third through-electrode 328 extending through the second substrate 200, the third insulating interlayer 310 and an upper portion of the second insulating interlayer 270 to contact the fifth wiring 248 may be further formed so that the I/O pad 306 and the fifth wiring 248 may be electrically connected to each other. In some embodiments, the I/O pad 306 may extend through the first substrate 100 instead of the second and third substrates 200 and 400.

Figure 20:
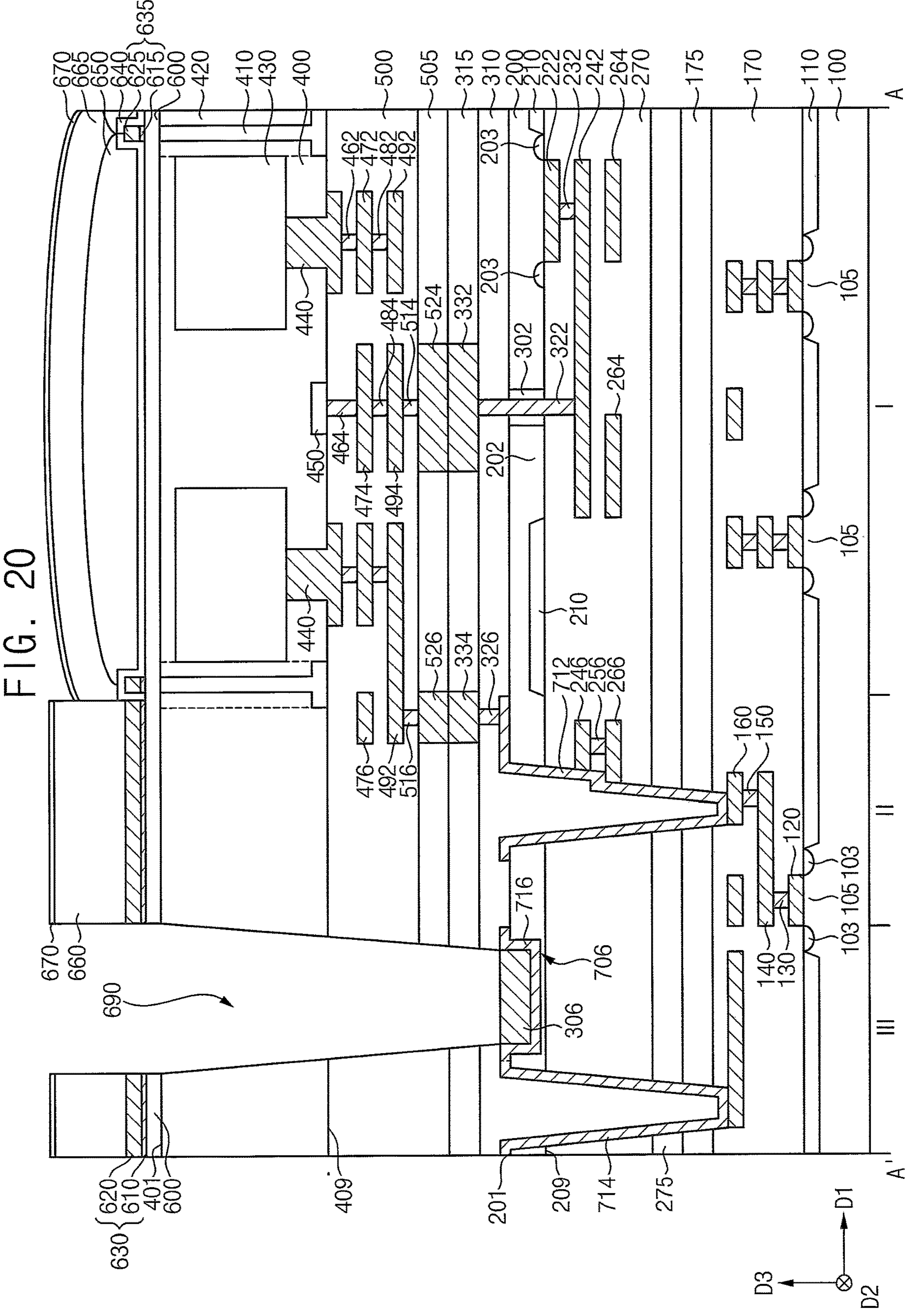
FIG. 20 is a cross-sectional view illustrating an image sensor in accordance with example embodiments.

FIG. 20 is a cross-sectional view illustrating an image sensor in accordance with example embodiments. This image sensor may be substantially the same as or similar to that of FIGS. 1 and 2, except for some elements, and thus, repeated explanations thereof are omitted herein. Referring to FIG. 20, in the image sensor, the first and second substrates 200 and 400 may be bonded with each other through fourth and fifth through-electrodes 712 and 714 instead of the first to fourth adhesion pads 192, 194, 296 and 298.

In example embodiments, the fourth through-electrode 712 may extend through the second substrate 200, the second insulating interlayer 270, the first and second adhesion layers 175 and 275, and an upper portion of the first insulating interlayer 170, and may be covered by the third insulating interlayer 310. In example embodiments, the fourth through-electrode 712 may be electrically connected to the sixth adhesion pad 334 through a thirteenth via 326 in the third insulating interlayer 310, and may contact the second wiring 160 on the first substrate 100 to be electrically connected thereto. The fourth through-electrode 712 may contact a sidewall of the fourth wiring 246 and a sidewall and an upper surface of the seventh wiring 266 to be electrically connected thereto.

The fifth through-electrode 714 may extend through the second substrate 200, the second insulating interlayer 270, the first and second adhesion layers 175 and 275, and an upper portion of the first insulating interlayer 170, and may be covered by the third insulating interlayer 310. In example embodiments, the fifth through-electrode 714 may be electrically connected to the I/O pad 306 through a fourth conductive pattern 716 on the second substrate 200, and may contact the second wiring 160 on the first substrate 100 to be electrically connected thereto. A lower surface and a sidewall of the I/O pad 306 may be covered by the fourth conductive pattern 716.

Figure 21:
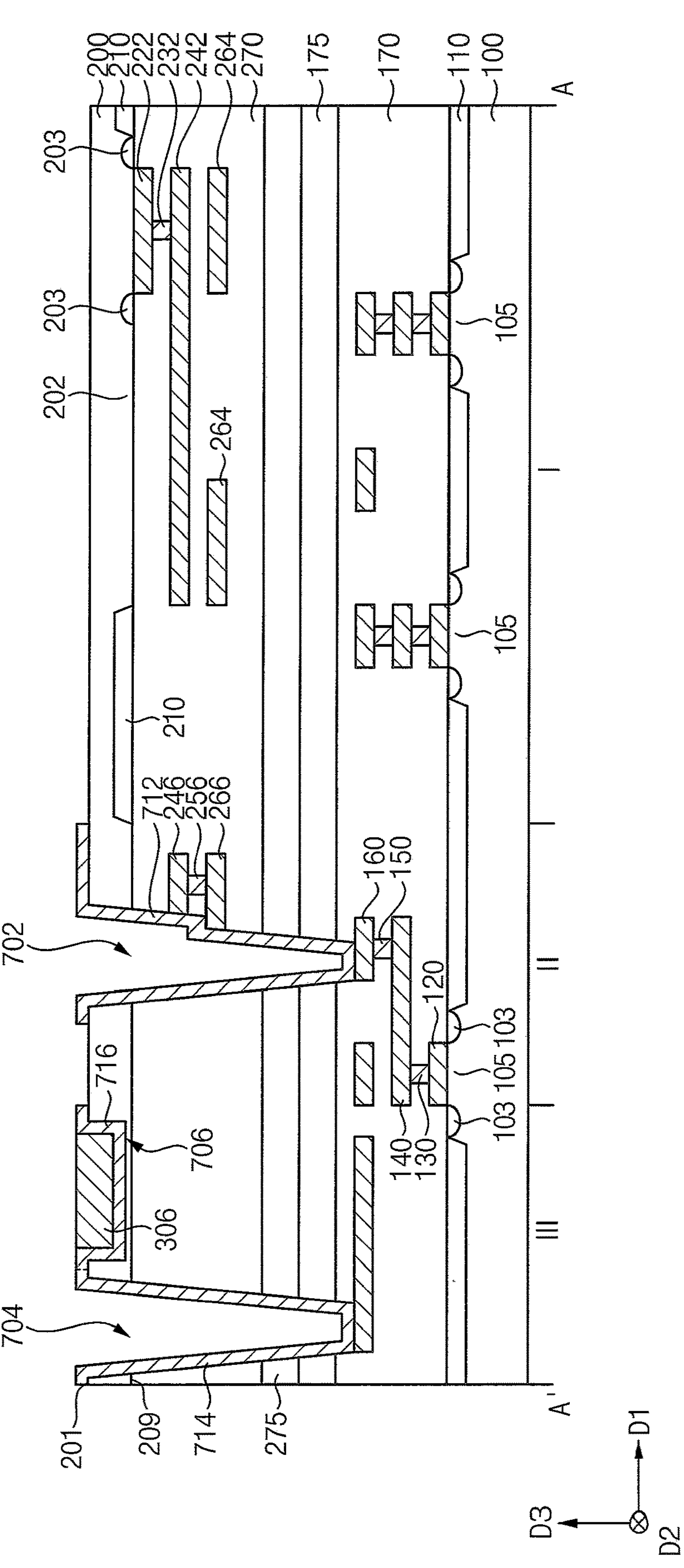
FIGS. 21 and 22 are cross-sectional views illustrating a method of manufacturing an image sensor in accordance with example embodiments.
Figure 22:
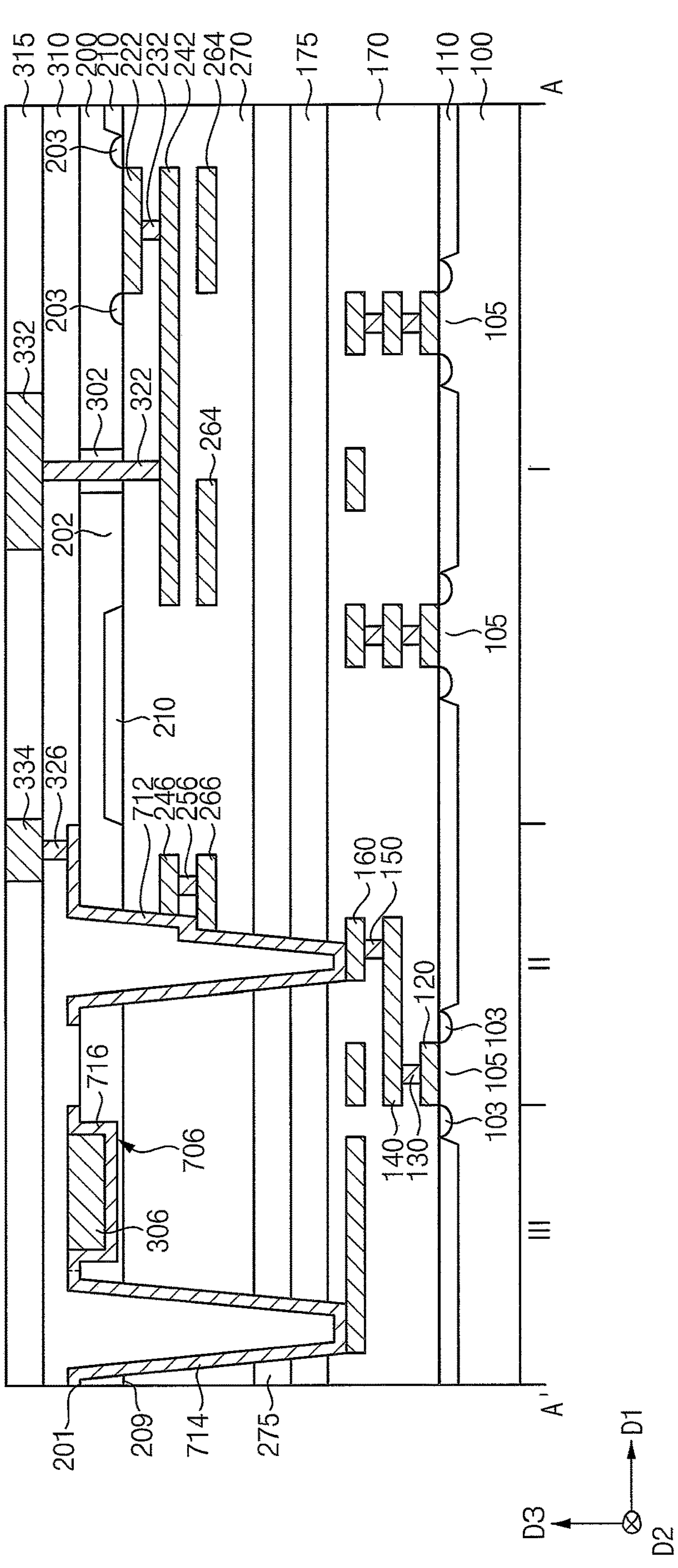

FIGS. 21 and 22 are cross-sectional views illustrating a method of manufacturing an image sensor in accordance with example embodiments. This method may include processes substantially the same as or similar to those of FIGS. 1 to 18, and thus, repeated explanations thereof are omitted herein.

Referring to FIG. 21, processes substantially the same as or similar to those of FIGS. 3 to 9 may be performed. However, the second, fourth, fifth and sixth vias 180, 258, 286 and 288, the fifth wiring 248, the first to fourth adhesion pads 192, 194, 296 and 298, and the I/O pad 306 may not be formed.

An upper portion of the second substrate 200 may be removed by a polishing process, such as a grinding process, a CMP process, etc. The second substrate 200, the second insulating interlayer 270, the first and second adhesion layers 175 and 275 and an upper portion of the first insulating interlayer 170 may be partially removed to form fourth and fifth openings 702 and 704 exposing upper surfaces of the second wirings 160, respectively, in the second and third regions II and III, respectively. Additionally, a third recess 706 at an upper portion of the second substrate 200 may be formed in the third region III. The fourth opening 702 may expose a sidewall of the fourth wiring 246, and a sidewall and an upper surface of the seventh wiring 266.

A second conductive layer may be formed on a bottom and a sidewall of each of the fourth and fifth openings 702 and 704, a bottom and a sidewall of the third recess 706, and the first surface 201 of the second substrate 200, and the I/O pad 306 may be formed in the third recess 706.

The second conductive layer may be patterned. Portions of the second conductive layer adjacent to the fourth and fifth openings 702 and 704 and the third recess 706 may not be removed but remain. Before forming the second conductive layer, a barrier layer may be further formed on the bottom and the sidewall of each of the fourth and fifth openings 702 and 704, the bottom and the sidewall of the third recess 706, and the first surface 201 of the second substrate 200.

Thus, a second conductive pattern 712 may be formed on the bottom and the sidewall of the fourth opening 702 and a portion of the first surface 201 of the second substrate 200 adjacent to the fourth opening 702, a third conductive pattern 714 may be formed on the bottom and the sidewall of the fifth opening 704 and a portion of the first surface 201 of the second substrate 200 adjacent to the fifth opening 704, and a fourth conductive pattern 716 may be formed on the bottom and the sidewall of the third recess 706 and a portion of the first surface 201 of the second substrate 200 adjacent to the third recess 706. The second and third conductive patterns 712 and 714 may also be referred as fourth and fifth through-electrodes 712 and 714, respectively. The lower surface and the sidewall of the I/O pad 306 may be covered by the fourth conductive pattern 716.

Referring to FIG. 22, the first insulation pattern 302 may be formed through a portion of the second substrate 200 overlapping the third wiring 242 in the third direction D3, and the third insulating interlayer 310 may be formed on the fourth and fifth through-electrodes 712 and 714, the I/O pad 306, the fourth conductive pattern 716, the first surface 201 of the second substrate 200, and the first insulation pattern 302 to fill the fourth and fifth openings 702 and 704.

The first through-electrode 322 extending through the third insulating interlayer 310, the first insulation pattern 302 and an upper portion of the second insulating interlayer 270 to contact an upper surface of the third wiring 242, and a thirteenth via 326 extending through the third insulating interlayer 310 to contact an upper surface of the fourth through-electrode 712 may be formed.

The third adhesion layer 315 may be formed on the third insulating interlayer 310, the first through-electrode 322 and the thirteenth via 326, and the fifth and sixth adhesion pads 332 and 334 may be formed through the third adhesion layer 315 to contact the first through-electrode 322 and the thirteenth via 326.

Referring to FIG. 20 again, processes substantially the same as or similar to those of FIGS. 12 to 18 and FIGS. 1 and 2 may be performed to complete the fabrication of the image sensor.

Figure 23:
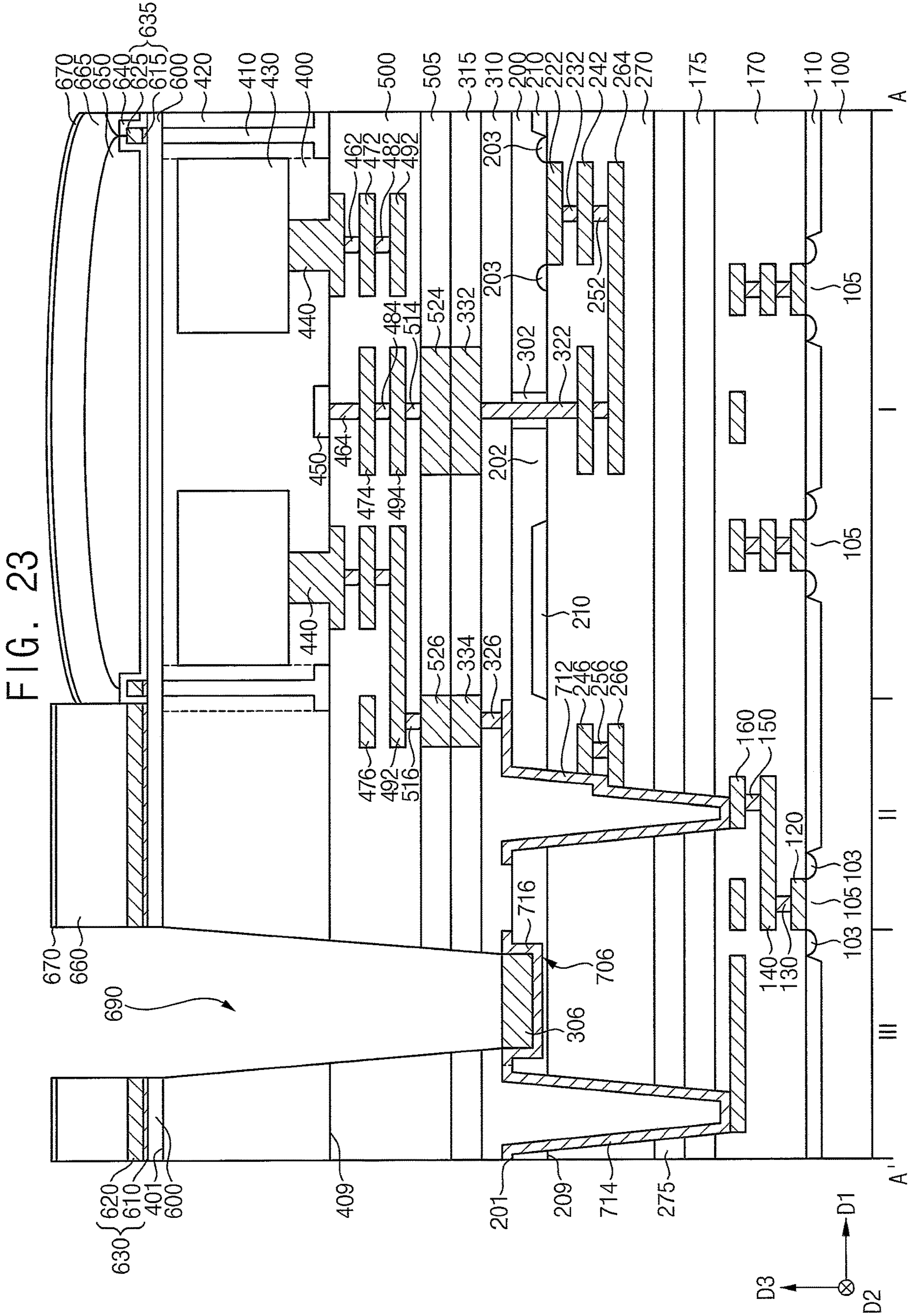
FIG. 23 is a cross-sectional view illustrating an image sensor in accordance with example embodiments.

FIG. 23 is a cross-sectional view illustrating an image sensor in accordance with example embodiments. This image sensor may be substantially the same as or similar to that of FIGS. 1 and 2, except for some elements, and thus, repeated explanations thereof are omitted herein. Referring to FIG. 23, the second gate electrode 222 of the source follower transistor may be electrically connected to the first through-electrode 322 through a fourteenth via 252 contacting a lower surface of the third wiring 242 and an upper surface of the sixth wiring 264 and the sixth wiring 264 contacting a lower surface of the fourteenth via 252, in addition to the second contact plug 232 and the third wiring 242.

Figure 24:
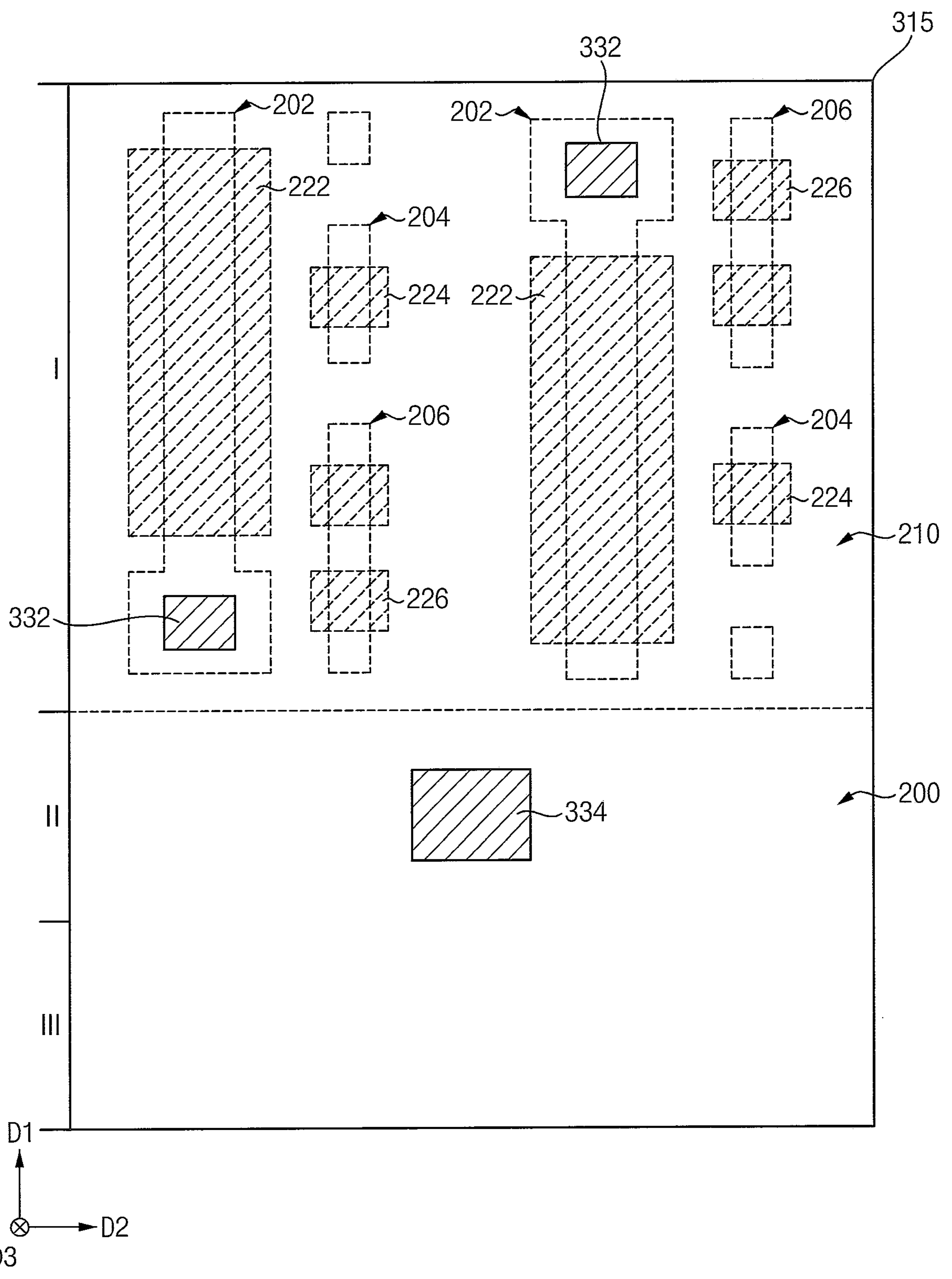
FIGS. 24 and 25 are plan views illustrating an image sensor in accordance with example embodiments.
Figure 25:
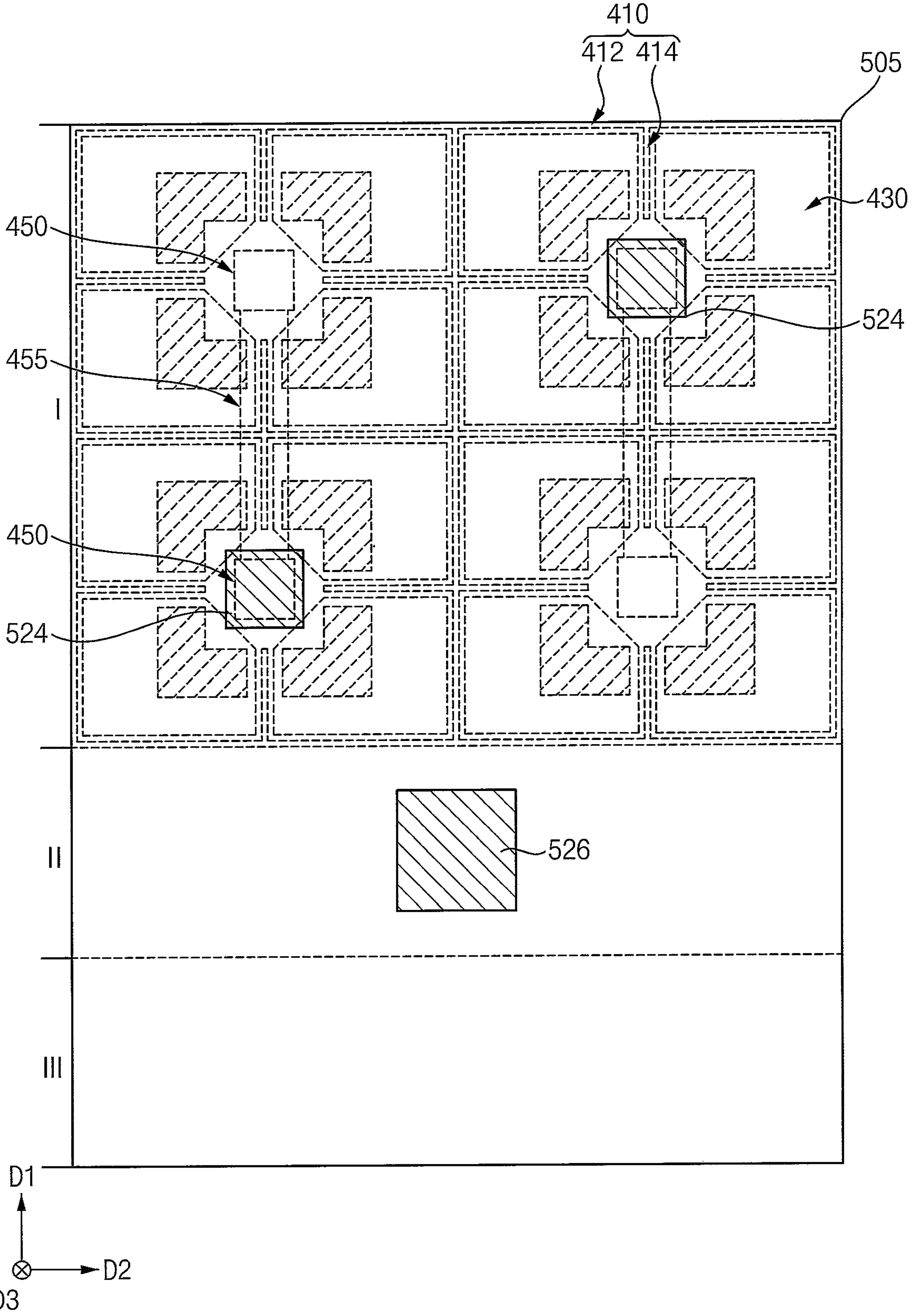

FIGS. 24 and 25 are plan views illustrating an image sensor in accordance with example embodiments, which correspond to FIGS. 10 and 14, respectively. This image sensor may be substantially the same as or similar to that of FIGS. 1 and 2, except for the layouts of the TG 440, the FD region 450 and the fifth and seventh adhesion pads 332 and 524 on the third substrate 300, and thus, repeated explanations thereof are omitted herein.

Referring to FIG. 25, neighboring 4 unit pixel regions shown in FIG. 14 may form a pixel region set, and neighboring 4 pixel region sets may form a pixel region group. In example embodiments, 2 FD regions 450 neighboring in the first direction D1 in the pixel region group may be electrically connected to each other through a sixteenth wiring 455 to form a FD region pair, and thus 2 FD region pairs may be formed to be spaced apart from each other in the pixel region group.

In example embodiments, the third adhesion pad structure including the fifth and seventh adhesion pads 332 and 524 may be electrically connected to each of the FD region pairs, and may overlap in the third direction D3 one of the FD regions 450 spaced apart from each other in the first direction D1. In example embodiments, 2 third adhesion pad structures in the pixel region group may be placed in a symmetrical position with reference to a central portion of the pixel region group in a plan view.

Referring to FIG. 24, the layout of the second to fourth transistors on the second substrate 200 may be transformed in correspondence to the layout of the FD region 450 and the third adhesion pad structure included in the pixel region group. Particularly, the second to fourth transistors may be placed in correspondence to each of the FD region pairs each including 2 FD regions 450 neighboring in the first direction D1, and the second to fourth transistors may be placed in a symmetrical position with reference to a central portion of the pixel region group in a plan view.

Figure 26:
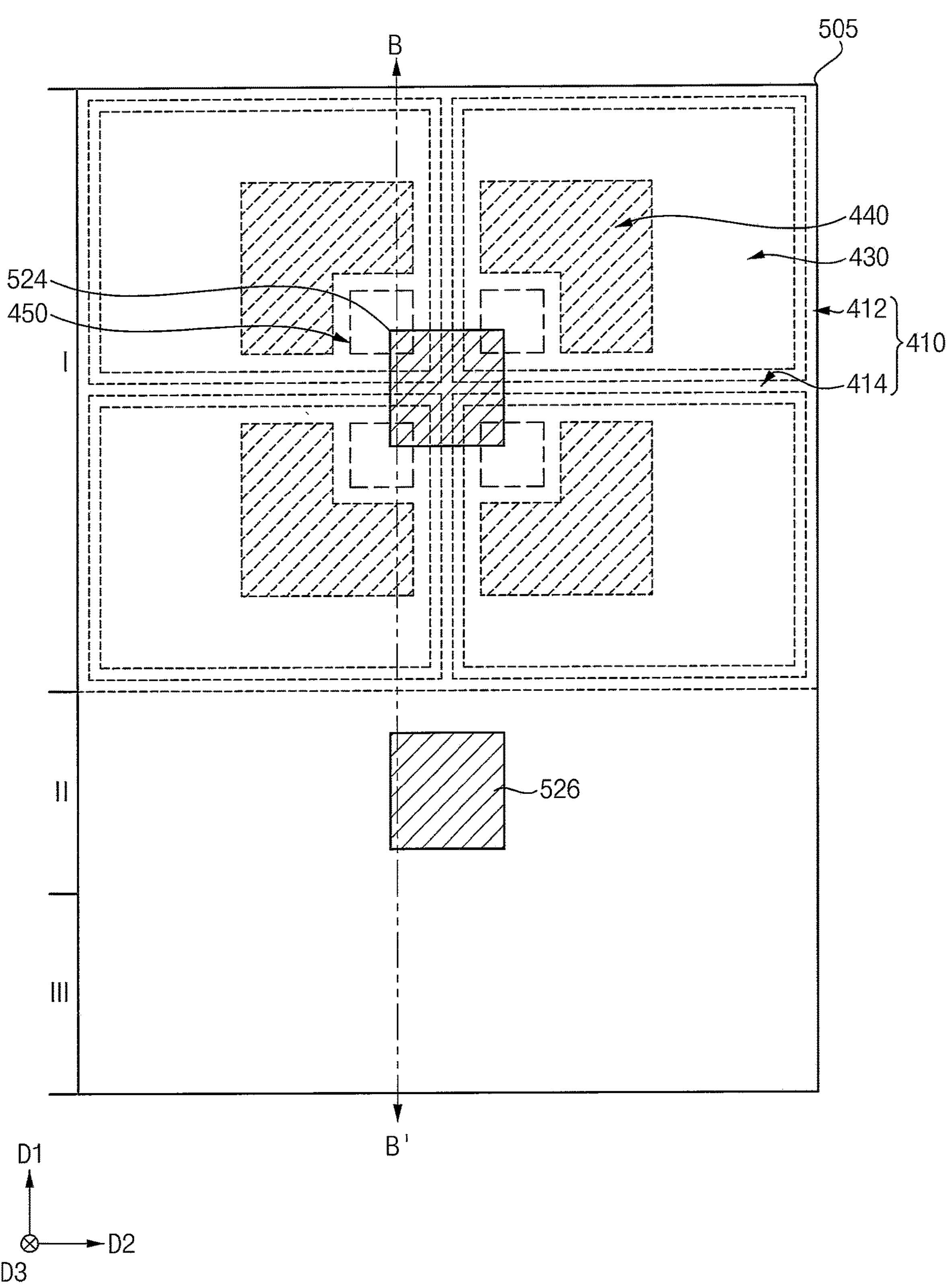
FIGS. 26 and 27 are a plan view and a cross-sectional view, respectively, which illustrate an image sensor in accordance with example embodiments shown in FIGS. 14 and 2, respectively.
Figure 27:
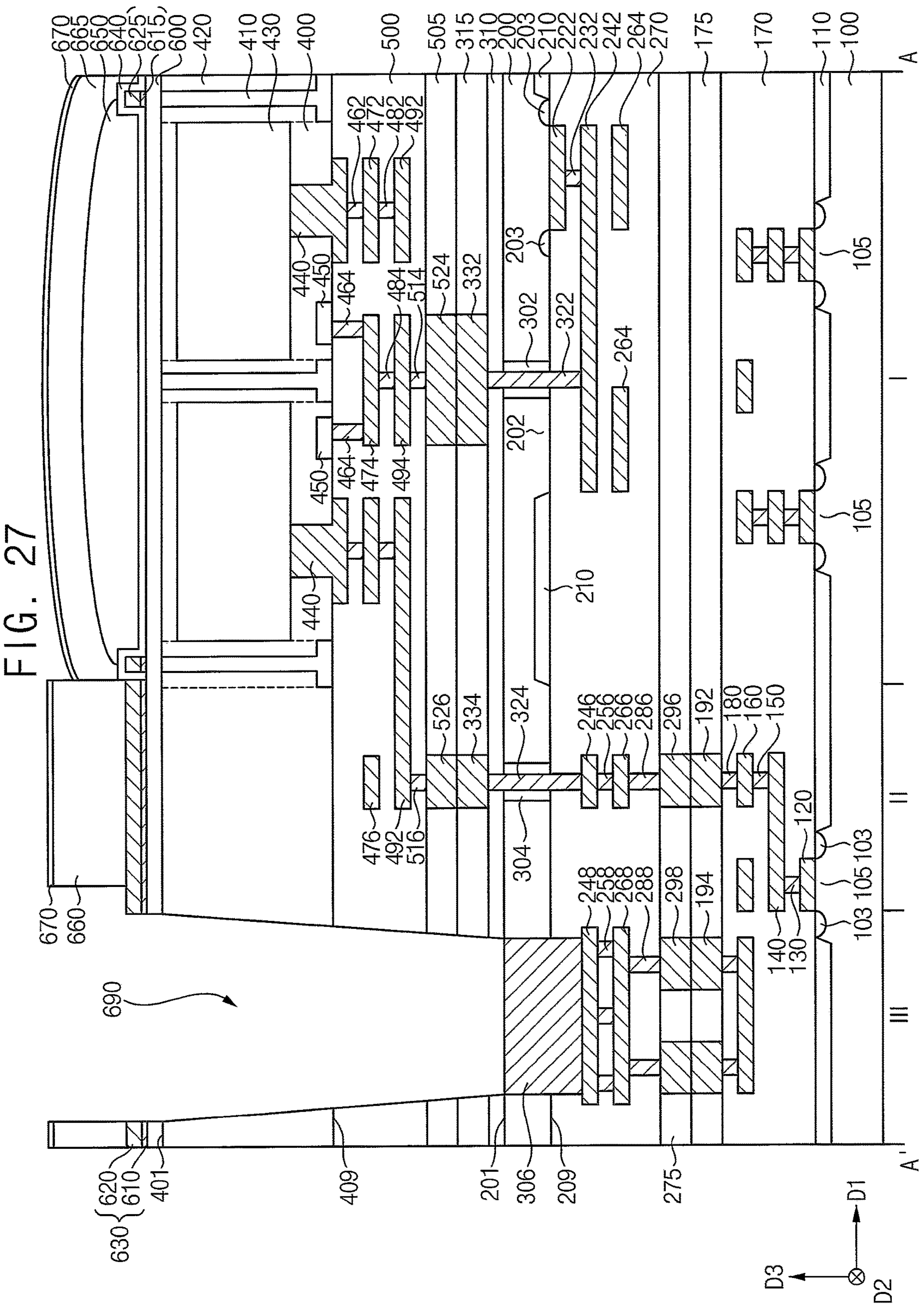

FIGS. 26 and 27 are a plan view and a cross-sectional view illustrating an image sensor in accordance with example embodiments, which correspond to FIGS. 14 and 2, respectively. This image sensor may be substantially the same as or similar to that of FIGS. 1 and 2, except for the layouts of the light sensing element 430, the TG 440 and the FD region 450, and thus, repeated explanations thereof are omitted herein.

Referring to FIGS. 26 and 27, the second pixel division patterns 414 extending from the first pixel division pattern 412 may not be spaced apart from each other, but may be connected to each other, and thus a unit pixel region may be defined by the first and second pixel division patterns 412 and 414.

In example embodiments, the light sensing element 430, the TG 440 and the FD region 450 may be formed in each of the unit pixel region. That is, the FD region 450 may not be commonly formed at a central portion of neighboring 4 unit pixel regions. The FD regions 450 in the neighboring 4 unit pixel regions, respectively, may be electrically connected to the tenth wiring 474 through the fourth contact plug 464, and thus may be electrically connected to the source follower transistor, that is, the second transistor beneath the second substrate 200 through the third adhesion pad structure including the fifth and seventh adhesion pads 332 and 524.

Figure 28:
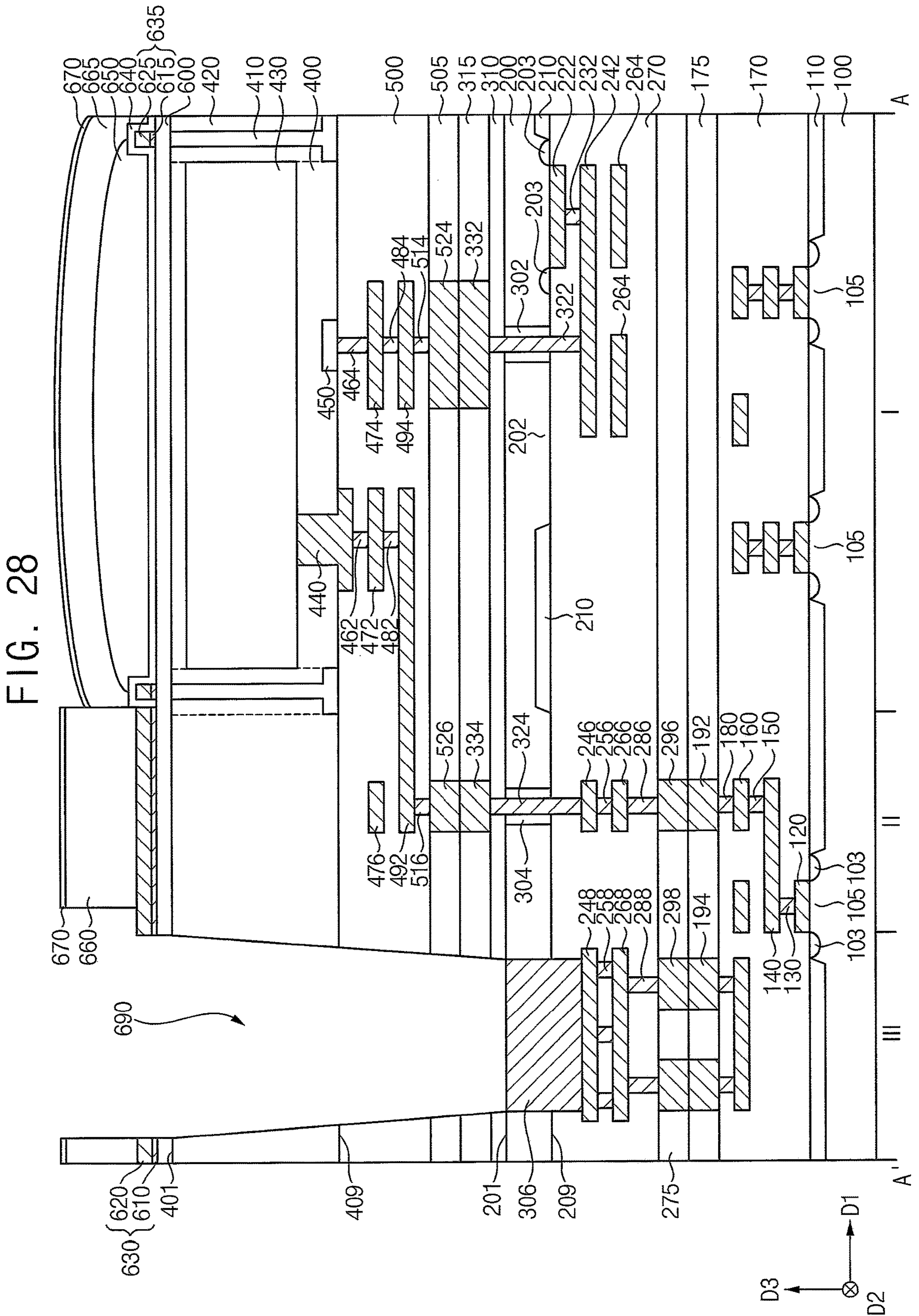
FIG. 28 is a cross-sectional view illustrating an image sensor in accordance with example embodiments

FIG. 28 is a cross-sectional view illustrating an image sensor in accordance with example embodiments, which corresponds to FIG. 27. This image sensor may be substantially the same as or similar to that of FIGS. 26 and 27, except for the electrical connection between the FD region 450 and the fourth contact plug 464, and thus, repeated explanations thereof are omitted herein.

Referring to FIG. 28, unlike those of FIGS. 26 and 27, the FD regions 450 in the neighboring unit pixel regions, respectively, may independently contact the fourth contact plugs 464. Thus, the FD regions 450 in the unit pixel region of the third substrate 400 may be independently electrically connected to the source follower transistors beneath the second substrate 200.

As described above, although the present invention has been described with reference to example embodiments, those skilled in the art will readily appreciate that many modifications are possible in the example embodiments without materially departing from the novel teachings and advantages of the present inventive concept.

What is claimed is:

1. An image sensor, comprising:

a first semiconductor substrate having a first transistor integrated therein;

a first plurality of wiring structures on the first semiconductor substrate, said first plurality of wiring structures including a first wiring structure electrically connected to the first transistor;

a second semiconductor substrate on the first plurality of wiring structures, said second semiconductor substrate having a second transistor integrated therein, which is electrically connected to a second wiring structure within the first plurality of wiring structures;

a second plurality of wiring structures on the second semiconductor substrate;

a third semiconductor substrate on the second plurality of wiring structures;

a microlens on a light receiving surface of the third semiconductor substrate;

a light sensing element within the third semiconductor substrate;

a transfer gate (TG) extending into a portion of the third semiconductor substrate, said TG extending adjacent the light sensing element and electrically connected to a first wiring structure within the second plurality of wiring structures;

a floating diffusion (FD) region extending within the third semiconductor substrate and adjacent the TG, said FD region electrically connected to a second wiring structure within the second plurality of wiring structures;

a first through-electrode, which extends through the second semiconductor substrate and is electrically connected to the second transistor; and an adhesion layer between the second semiconductor substrate and the third semiconductor substrate, the adhesion layer having an adhesion pad electrically connected to the first through-electrode, and the adhesion pad having an adhesion surface that is wider, in a direction parallel to the second semiconductor substrate, than the first through-electrode.

2. The image sensor of claim 1, further comprising:

a second through-electrode, which extends through the second semiconductor substrate and electrically connects a wiring structure within the second plurality of wiring structures to a wiring structure within the first plurality of wiring structures.

3. The image sensor of claim 1, further comprising a color filter array layer extending between the microlens and the third semiconductor substrate.

4. The image sensor of claim 1, wherein the first plurality of wiring structures are embedded within a first electrically insulating material(s); and wherein the second plurality of wiring structures are embedded within a second electrically insulating material(s).

5. The image sensor of claim 4, wherein at least some of the first plurality of wiring structures are bonded together so that electrical signals are passed between the first and second semiconductor substrates; and wherein at least some of the second plurality of wiring structures are bonded together so that electrical signals are passed between the second and third semiconductor substrates.

6. The image sensor of claim 4, further comprising an opening, which extends through the third semiconductor substrate and the second electrically insulating material(s).

7. The image sensor of claim 6, wherein the opening exposes an I/O pad within the second semiconductor substrate.

8. The image sensor of claim 1, further comprising a pixel division structure, which extends through the third semiconductor substrate and defines a unit pixel region therein.

9. The image sensor of claim 8, wherein the second transistor is a source follower transistor; wherein the image sensor further comprises a select transistor and a reset transistor beneath the second substrate; and wherein the select transistor and the reset transistor are spaced apart from each other in a first direction parallel to an upper surface of the first substrate, and the source follower transistor is spaced apart from the select transistor or the reset transistor in a second direction parallel to the upper surface of the first substrate and crossing the first direction.

10. The image sensor of claim 1, wherein the second transistor is configured as a source follower transistor.

11. The image sensor of claim 10, wherein the second semiconductor substrate further comprises a select transistor and a reset transistor therein, which are associated with a corresponding unit pixel within the third semiconductor substrate.

12. An image sensor, comprising:

a first substrate having a first transistor thereon;

a first wiring electrically connected to the first transistor, on the first substrate;

second and third wirings on the first wiring;

a second substrate on the second and third wirings, the second substrate having a second transistor therein, which is electrically connected to the second wiring;

fourth and fifth wirings on the second substrate;

a third substrate on the fourth and fifth wirings;

a color filter array layer having color filters therein, on the third substrate;

a microlens on the color filter array layer;

a light sensing element in the third substrate;

a transfer gate (TG) extending through a lower portion of the third substrate, the TG extending adjacent to the light sensing element and electrically connected to the fourth wiring;

a floating diffusion (FD) region at a lower portion of the third substrate adjacent to the TG, the FD region being electrically connected to the fifth wiring;

a first through-electrode extending through the second substrate, the first through-electrode being electrically connected to the second transistor and the fifth wiring; and a second through-electrode extending through the second substrate, the second through-electrode contacting the first and third wirings and being electrically connected to the fourth wiring, and the second through-electrode being spaced, in a direction parallel to the second substrate, from the microlens.

13. The image sensor of claim 12, wherein the first through-electrode contacts an upper surface of the second wiring; and wherein the image sensor further comprises a first adhesion pad, which contacts an upper surface of the first through-electrode and is electrically connected to the fifth wiring.

14. The image sensor of claim 13, further comprising a second adhesion pad at the same level as that of the first adhesion pad, the second adhesion pad being electrically connected to the second through-electrode and the fourth wiring.

15. The image sensor of claim 12, further comprising:

a third transistor; and a sixth wiring at a level lower than that of the second wiring, the sixth wiring being electrically connected to the third transistor, and at least a portion of the sixth wiring overlapping the second wiring in a vertical direction perpendicular to an upper surface of the first substrate.

16. The image sensor of claim 12, wherein the first, second and third substrates are sequentially stacked in a vertical direction, and commonly include a pixel region, a connection region surrounding the pixel region, and a pad region surrounding the connection region;

wherein the color filter array layer and the microlens are formed in the pixel region;

wherein the image sensor further includes a pixel division structure extending through the third substrate in the pixel region and defining unit pixel regions in which unit pixels are formed, respectively; and wherein the light sensing element and the TG are formed in each of the unit pixel regions.

17. The image sensor of claim 16, wherein the FD region is commonly formed in portions of four neighboring pixel regions among the pixel regions; and wherein the first through-electrode overlaps the FD region in the vertical direction.

18. The image sensor of claim 16, wherein the second and fifth wirings and the first through-electrode are formed in the pixel region, the second through-electrode is formed in the connection region, and the fourth wiring is commonly formed in the pixel region and the connection region, and wherein the image sensor further comprises:

a first adhesion pad in the pixel region, the first adhesion pad contacting an upper surface of the first through-electrode and being electrically connected to the fifth wiring; and a second adhesion pad at the same level as that of the first adhesion pad in the connection region, the second adhesion pad being electrically connected to the second through-electrode and the fourth wiring.

19. The image sensor of claim 16, wherein the first and third wirings are formed in the connection region; and wherein the image sensor further comprises:

a sixth wiring in the pad region on the first substrate, the sixth wiring being spaced apart from the first wiring;

a third through-electrode extending through the second substrate and contacting the sixth wiring; and an I/O pad in the pad region in the second substrate, the I/O pad being electrically connected to the third through-electrode.

20. An image sensor, comprising:

first, second and third substrates sequentially stacked in a vertical direction, the first, second and third substrates commonly including a pixel region and a connection region surrounding the pixel region, and the connection region including connection wirings for transferring electrical signals in the vertical direction;

a first transistor beneath the second substrate in the pixel region;

a first wiring under the first transistor in the pixel region, the first wiring being electrically connected to the first transistor;

a second wiring under the second substrate in the connection region;

a first through-electrode extending through the second substrate in the pixel region, the first through-electrode being electrically connected to the first wiring;

a second through-electrode extending through the second substrate in the connection region, the second through-electrode being electrically connected to the second wiring;

first and second adhesion pads on the second substrate, the first and second adhesion pads being electrically connected to the first and second through-electrodes, respectively, and the first and second adhesion pads being in the pixel region and the connection regions, respectively;

third and fourth wirings on and electrically connected to the first and second adhesion pads, respectively, said fourth wiring extending from the pixel region to the connection region;

a light sensing element in the third substrate;

a transfer gate (TG) extending through a lower portion of the third substrate, the TG being adjacent to the light sensing element in the pixel region and electrically connected to the fourth wiring; and a floating diffusion (FD) region at a lower portion of the third substrate adjacent to the TG, the FD region being electrically connected to the third wiring, wherein the second through-electrode is configured to provide a control signal to the TG.

* * * * *